(12) United States Patent
Hiroki

(10) Patent No.: US 8,057,153 B2
(45) Date of Patent: Nov. 15, 2011

(54) SUBSTRATE TRANSFER DEVICE, SUBSTRATE PROCESSING APPARATUS AND SUBSTRATE TRANSFER METHOD

(75) Inventor: Tsutomu Hiroki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 976 days.

(21) Appl. No.: 11/850,350

(22) Filed: Sep. 5, 2007

(65) Prior Publication Data

US 2008/0056857 A1 Mar. 6, 2008

Related U.S. Application Data

(60) Provisional application No. 60/844,081, filed on Sep. 13, 2006.

(30) Foreign Application Priority Data

Sep. 5, 2006 (JP) ................................. 2006-239983

(51) Int. Cl.
*H01L 21/677* (2006.01)
(52) U.S. Cl. .................................. 414/609; 414/222.01
(58) Field of Classification Search .................. 414/217, 414/217.1, 935, 936, 941, 222.01, 222.07, 414/222.08, 594, 609, 662, 672
See application file for complete search history.

(56) References Cited

U.S. PATENT DOCUMENTS

| | | | | |
|---|---|---|---|---|
| 5,518,542 A * | 5/1996 | Matsukawa et al. | ............ | 118/52 |
| 5,700,127 A * | 12/1997 | Harada et al. | ............ | 414/416.08 |
| 5,899,653 A * | 5/1999 | Brodine | ................... | 414/222.04 |
| 6,198,074 B1 * | 3/2001 | Savas | ............................. | 219/390 |
| 6,293,749 B1 * | 9/2001 | Raaijmakers et al. | ........ | 414/609 |
| 6,343,905 B1 * | 2/2002 | Adams et al. | ............ | 414/222.08 |
| 6,435,798 B1 * | 8/2002 | Satoh | ............................ | 414/217 |
| 6,485,248 B1 * | 11/2002 | Taylor, Jr. | ..................... | 414/672 |
| 6,528,427 B2 * | 3/2003 | Chebi et al. | ................... | 438/694 |
| 6,530,157 B1 * | 3/2003 | Henderson et al. | ............. | 33/644 |
| 6,549,825 B2 * | 4/2003 | Kurata | .......................... | 700/245 |
| 6,612,315 B2 * | 9/2003 | Pascal et al. | ................. | 134/25.4 |
| 6,632,068 B2 * | 10/2003 | Zinger et al. | .................. | 414/800 |
| 6,969,227 B2 * | 11/2005 | Kinnard et al. | ............ | 414/744.2 |
| 2002/0098713 A1 * | 7/2002 | Henley et al. | ................. | 438/776 |
| 2003/0000469 A1 * | 1/2003 | Pyo | ............................... | 118/715 |
| 2006/0182528 A1 * | 8/2006 | Fan et al. | ...................... | 414/155 |

FOREIGN PATENT DOCUMENTS

| | | |
|---|---|---|
| JP | 8-8328 | 1/1996 |
| JP | 9-181154 | 7/1997 |
| JP | 2002-280287 | 9/2002 |
| JP | 2006-71395 | 3/2006 |

* cited by examiner

*Primary Examiner* — Saul Rodriguez
*Assistant Examiner* — Glenn Myers
(74) *Attorney, Agent, or Firm* — Oblon, Spivak, McClelland, Maier & Neustadt, L.L.P.

(57) ABSTRACT

To correct any positional misalignment of a substrate manifesting along the horizontal direction by utilizing a substrate transfer device alone without engaging a transfer arm in operation. A substrate transfer device comprises a plurality of support pins disposed at positions set apart from one another around a support shaft of a stage, which support a substrate, e.g., a wafer W, on the bottom surface thereof, a base at which the support pins are mounted, a vertical drive means (Z-direction drive means) for raising/lowering the substrate by driving the support pins up/down via the base and a horizontal drive means (X-direction drive means, Y-direction drive means) for adjusting the position of the substrate along the horizontal direction (X and Y directions) by horizontally driving the support pins via the base.

8 Claims, 14 Drawing Sheets

SUBSTRATE TRANSFER DEVICE, SUBSTRATE PROCESSING APPARATUS AND SUBSTRATE TRANSFER METHOD

CROSS-REFERENCE TO RELATED APPLICATIONS

This document claims priority to Japanese Patent Application Number 2006-239983, filed on Sep. 5, 2006 and U.S. Provisional Application No. 60/844,081, filed on Sep. 13, 2006, the entire content of which are hereby incorporated by reference.

FIELD OF THE INVENTION

The present invention relates to a substrate transfer device, a substrate processing apparatus and a substrate transfer method.

BACKGROUND OF THE INVENTION

Through a semiconductor integrated circuit manufacturing process, an integrated circuit is formed on a processing target substrate such as a semiconductor wafer (hereafter may be simply referred to as a "wafer") normally by repeatedly executing various types of processing such as film formation, etching and heat treatment. In addition, the wafer having undergone the various types of processing may further undergo a specific type of post-processing. Such post-processing may be, for instance, wafer cleaning processing (e.g., processing executed to remove matter having settled on the wafer) or processing executed to determine through measurement the processing results (e.g., film thickness measurement processing or particle measurement processing).

The wafer processing described above may be executed in, for instance, a substrate processing apparatus that includes a processing chamber where specific types of processing such as plasma processing and measurement processing can be executed. The substrate processing apparatus may include a transfer robot with a transfer arm that carries the wafer into the processing chamber by rotating and moving forward/backward. The wafer is usually transferred from the transfer arm onto a stage installed in the processing chamber.

There is a method known in the related art that is adopted when transferring the wafer as described above, whereby a plurality of support pins passing through the stage are made to move up/down so as to receive the wafer from the transfer arm onto the support pins and then set the wafer onto the stage (see, for instance, patent reference literature 1). In another transfer method, the wafer, held by tweezers constituting part of the transfer robot, is transferred onto the stage by a rotary arm disposed between the transfer robot and the stage (see patent reference literature 2).

In order to ensure that the wafer placed on the stage is processed in an optimal manner, the wafer must be accurately positioned on the stage by not allowing any positional misalignment of the wafer along the horizontal direction. Accordingly, if the wafer is misaligned along the horizontal direction, the wafer is taken off the stage by the transfer arm, the misalignment is corrected at the transfer arm or the transfer robot and then the wafer is replaced onto the stage in the related art.

More specifically, if the wafer, having been transferred by moving up/down the support pins as disclosed in patent reference literature 1 is determined to be misaligned, the wafer on the stage is lifted up with the support pins and the transfer arm waiting in place, retrieves the wafer. The wafer position is then adjusted by manipulating the transfer arm before the wafer is set back on the stage.

If the transfer robot itself includes a wafer alignment device as disclosed in patent reference literature 2, the wafer position is corrected on the tweezers of the transfer robot and then the wafer is carried back onto the stage by the rotary arm (see FIGS. 2 and 3 in patent reference literature 2).

The transfer arm or the transfer robot engaged in the misalignment correction as described above cannot perform another operation (e.g., the transfer arm or the transfer robot cannot be engaged in the transfer of another wafer). This gives rise to a problem in that the throughput of the wafer processing becomes poorer.

This concern is addressed in the method proposed in the related art, whereby the stage is displaced along the X-direction and the Y-direction in order to correct misalignment of the wafer manifesting along the horizontal direction without engaging the transfer arm. For instance, patent reference literature 3 discloses a method whereby the stage with the wafer placed thereupon is rotated and wafer misalignment is detected by detecting the entire outer circumferential edge of the wafer with a CCD linear sensor and then the detected misalignment is corrected by displacing the stage along the XY directions.

In addition, patent reference literature 4 discloses a method whereby the outer edge of the wafer is photographed with a plurality of CCD cameras while supporting the wafer with a rotary support member (carrier arm) suspended inside the processing chamber, the wafer position is detected based upon the photographing results and any misalignment of the wafer is corrected by displacing the stage along the X and Y directions.

However, in the method disclosed in patent reference literature 3, the wafer must be lowered onto the stage via a wafer lift to detect wafer misalignment and if any wafer misalignment is detected, the wafer needs to be lifted off the stage via the wafer lift and the stage has to be displaced along the X and Y directions to correct the misalignment and then the wafer needs to be lowered onto the stage again. Since the wafer needs to be lifted up and lowered multiple times, the misalignment correction is bound to be a time-consuming operation, which, in turn, is bound to lower the throughput of the wafer processing.

One of the issues yet to be addressed with regard to the art disclosed in patent reference literature 4 is that if the wafer is misaligned to such an extent that the CCD cameras cannot detect the outer edge of the wafer, wafer misalignment detection is disabled and thus, the misalignment cannot be corrected by driving the stage along the X and Y directions. In addition, since the rotary support member (carrier arm) which supports the wafer does not move along the X direction and the Y direction, the positional correction along the X and Y directions cannot be achieved via the rotary support member (carrier arm) itself.

Accordingly, the wafer must be retrieved by the transfer robot or the transfer arm and then be set back onto the rotary support member (carrier arm). Since the transfer arm or the transfer robot cannot be engaged in another operation (e.g., the transfer of another wafer) during this process as explained earlier, the throughput of the wafer processing is bound to become lower.

(patent reference literature 1) Japanese Laid Open Patent Publication No. H06-097269
(patent reference literature 2) Japanese Laid Open Patent Publication No. H05-343500

(patent reference literature 3) Japanese Laid Open Patent Publication No. H08-008328

(patent reference literature 4) Japanese Laid Open Patent Publication No. 2002-280287

SUMMARY OF THE INVENTION

An object of the present invention, having been completed by addressing the problems of the related art discussed above, is to provide a substrate transfer device and the like, which ultimately improve the throughput of wafer processing by driving a substrate along the horizontal direction via support pins having received the substrate from the transfer arm and thus promptly correcting any substrate misalignment without having to engage the transfer arm or the transfer robot.

The object described above is achieved in an aspect of the present invention by providing a substrate transfer device that transfers a substrate between a transfer arm on which the substrate is carried and a stage on which the substrate is placed, comprising a plurality of support pins disposed at positions set apart from one another around a support shaft of the stage, which support the substrate on the bottom surface thereof, a base at which the support pins are mounted, a vertical drive means for raising/lowering the substrate by driving the support pins up/down via the base and a horizontal drive means for adjusting the position of the substrate along the horizontal direction by horizontally driving the support pins via the base.

According to the present invention, which includes support pins allowed to move along the horizontal direction (along the X and Y directions), a substrate having been transferred onto the support pins from, for instance, the transfer arm, can be driven along the horizontal direction via the support pins supporting the substrate without having to utilize the transfer arm. As a result, any positional misalignment of the substrate can be promptly corrected. In addition, once the substrate is transferred onto the support pins, the transfer arm can be immediately engaged in another operation. As a result, the substrate processing throughput can be improved.

It is desirable that a substrate position detection means for detecting the horizontal position of the substrate supported on the support pins be disposed near the stage. With such a substrate position detection means, the position of the substrate assumed along the horizontal direction can be detected and thus, a decision can be made as to whether or not the substrate is misaligned while the substrate is supported on the support pins. According to the present invention, the support pins, instead of the stage, are driven along the horizontal direction and thus, even when the extent of substrate misalignment is too great to be detected by the substrate position detection means, the substrate can be displaced along the horizontal direction via the support pins to a position at which the misalignment can be detected by the substrate position detection means while the substrate remains held up on the support pins. As a result, even when the substrate is misaligned to a great extent, the substrate position can be detected and the misalignment can be promptly corrected.

It is to be noted that the substrate position detection means should adopt a structure that enables detection of the circumferential edge of the substrate at, for instance, at least two points. As long as the circumferential edge of the substrate can be detected at least two positions, the central position of a disk-shaped substrate, such as a semiconductor wafer, can be determined.

The substrate transfer device may further comprise a control unit that executes substrate transfer processing so as to receive the substrate delivered by the transfer arm by raising the support pins via the vertical drive means, detect the position of the substrate along the horizontal direction with the substrate position detection means while the substrate is supported on the support pins, correct any misalignment of the substrate by driving the support pins along the horizontal direction via the horizontal drive means and finally place the substrate onto the stage by lowering the support pins via the vertical drive means.

The structure described above allows any misalignment to be corrected promptly by detecting the substrate position while it is supported on the support pins. In other words, the misalignment can be corrected more quickly than in the related art, in which the substrate position must be detected and any substrate misalignment must be corrected by engaging the transfer arm or the support pins to reposition the substrate on the stage. As a result, an improvement in the substrate processing throughput is achieved.

In addition, when taking the substrate off the transfer arm, the substrate may be placed onto the support pins in a raised state by lowering the transfer arm. In this case, the substrate can be transferred while the support pins remain in the raised state.

The plurality of support pins may be disposed around the support shaft of the stage at positions set apart from one another further inward relative to the radius of the stage, and the front ends of the individual support pins may be allowed to project out beyond and retract under the substrate placement surface of the stage via through holes formed at the stage. This structure makes it possible to support the substrate at points closer to the center thereof via the individual support pins and thus, the substrate is supported at points distanced from the processing target area while executing processing over the edge of the substrate placed on the stage (e.g., processing executed to remove material deposited on the edge of the substrate).

If the stage is allowed to rotate freely around the support shaft, the support pins should be lowered so as to ensure that the front ends of the support pins are retracted under the bottom surface of the stage while the stage is rotated. By lowering the support pins in this manner, it is ensured that the through holes and the support pins do not collide with each other while the stage rotates.

Alternatively, the plurality of support pins in the substrate transfer device may be disposed around the support shaft of the stage at positions set apart from one another further outward relative to the radius of the stage. This structure allows the substrate to be supported on the support pins without having to form through holes at the stage. In addition, since the extent to which the support pins are driven along the horizontal direction is not restricted by the through holes, the substrate can be displaced along the horizontal direction by a greater extent. Namely, the extent by which the substrate is displaced along the horizontal direction at once can be increased.

The object described above is also achieved in another aspect of the present invention by providing a substrate processing apparatus that executes a specific type of processing on a substrate placed on a stage disposed inside a processing chamber and includes a substrate transfer device disposed near the stage, which transfers the substrate between a transfer arm carrying the substrate into/out of the processing chamber and the stage. The substrate transfer device in this substrate processing apparatus comprises a plurality of support pins disposed at positions set apart from one another around a support shaft of the stage, which support the substrate on the bottom surface thereof, a base at which the support pins are mounted, a vertical drive means for raising/ lowering the substrate by driving the support pins up/down via the base and a horizontal drive means for adjusting the position of the substrate along the horizontal direction by horizontally driving the support pins via the base.

According to the present invention described above, any misalignment of the substrate can be promptly corrected by displacing the substrate along the horizontal direction via the support pins without having to engage the transfer arm. Thus, once the substrate is delivered to the substrate transfer device, the transfer arm can be immediately engaged in another operation and ultimately, the substrate processing throughput is improved. In addition, since the substrate is placed accurately onto the stage without any misalignment, the specific type of processing can be executed on the substrate in a stable manner.

The object described above is further achieved in yet another aspect of the present invention by providing a substrate processing apparatus that includes a plurality of processing chambers where specific types of processing are executed on substrates and processes a substrate continuously by transferring the substrate to the individual processing chambers in sequence via a transfer arm with at least one of the processing chambers used as a post-processing chamber to which the substrate having undergone processing in another processing chamber is transferred to undergo post-processing and equipped with a substrate transfer device that transfers the substrate between a stage disposed inside the post-processing chamber and the transfer arm. The substrate transfer device in this substrate processing apparatus comprises a plurality of support pins, which supports the substrate on the bottom surface thereof, a base at which the support pins are mounted, a vertical drive means for raising/lowering the substrate by driving the support pins up/down via the base and a horizontal drive means for adjusting the position of the substrate along the horizontal direction by horizontally driving the support pins via the base.

The likelihood of the substrate transferred into the post-processing chamber having become greatly misaligned after being repeatedly transferred into/out of other processing chambers by the transfer arm is naturally very high. However, with the substrate transfer device according to the present invention, even a great extent of substrate misalignment can be promptly and accurately corrected simply by driving the support pins supporting the substrate along the horizontal direction without having to retrieve the substrate from the processing chamber and then carrying it back into the processing chamber or having to set it back onto the stage, as in the related art. In other words, a significant advantage is achieved by adopting the substrate transfer device according to the present invention in conjunction with the post-processing chamber.

The post-processing chamber may be a cleaning processing chamber where material having settled onto the circumferential edge of the substrate is removed. It is desirable that the plurality of support pins in this substrate transfer device be disposed around the support shaft of the stage, at positions set apart from one another further inward relative to the radius of the stage, and that the front ends of the individual support pins be allowed to project out beyond and retract under the substrate placement surface of the stage via through holes formed at the stage. This structure makes it possible to support the substrate on the surface thereof at points closer to the substrate center via the individual support pins. As a result, material settled on the circumferential edge of the substrate can be removed, unhindered by the support pins.

The object described above is achieved in yet another aspect of the present invention by providing a transfer method to be adopted in a substrate transfer device that transfers a substrate between a transfer arm on which the substrate is carried and a stage on which the substrate is placed and includes a plurality of support pins disposed at positions set apart from one another around a support shaft of the stage, which support the substrate on the bottom surface thereof, a base at which the support pins are mounted, a vertical drive means for driving the support pins up/down via the base, a horizontal drive means for horizontally driving the support pins via the base and a substrate position detection means for detecting the position of the substrate along the horizontal direction. The transfer method comprises a receiving step in which the substrate is received from the transfer arm by raising the support pins via the vertical drive means, a detection step in which the position along the horizontal direction of the substrate having been received is detected with the substrate position detection means while the substrate remains supported at the support pins, a decision-making step in which a decision is made based upon the position of the substrate having been detected by the substrate position detection means as to whether or not the substrate is misaligned relative to a predetermined reference position, a placing step in which the substrate is placed onto the stage by lowering the support pins via the vertical drive means if the substrate has been judged not to be misaligned through the decision-making step and a correction/placing step in which the substrate having been judged to be misaligned through the decision-making step is correctly aligned by driving the support pins along the horizontal direction via the horizontal drive means and then the substrate is placed onto the stage by lowering the support pins via the vertical drive means.

According to the present invention described above, once the substrate is delivered onto the support pins from the transfer arm, any substrate misalignment can be promptly corrected by driving the support pins supporting the substrate along the horizontal direction without having to use the transfer arm. In addition, once the substrate is transferred onto the support pins, the transfer arm can be immediately engaged in another operation. As a result, the substrate processing throughput can be improved.

Furthermore, during the receiving step in which the substrate is received from the transfer arm, the substrate may be placed onto the support pins in a raised state by lowering the transfer arm. In this case, the substrate can be transferred while the support pins remain in the raised state.

In the detection step executed to detect the position of the substrate, the substrate may be displaced by driving the support pins along the horizontal direction if the substrate cannot be detected by the substrate position detection means, until the substrate position detection means is able to detect the substrate position. In this case, even when the substrate having been delivered onto the support pins is misaligned to an extent too great for the substrate position detection means to detect the substrate, the substrate, still supported on the support pins, can be displaced until the position of the substrate can be detected by the substrate position detection means. Thus, the misalignment can be corrected without having to reset the substrate onto the stage.

According to the present invention, any positional misalignment of the substrate can be corrected by displacing the substrate along the horizontal direction via the substrate transfer device without having to engage the transfer arm in operation. Thus, the transfer arm can be immediately engaged in another operation (e.g., the transfer of another substrate), once it delivers the substrate to the substrate transfer device. Furthermore, since any substrate misalignment can be corrected before it is placed on the stage, substrate misalignment correction is completed quickly. This, in turn, achieves an improvement in substrate processing throughput.

DETAILED DESCRIPTION OF THE PREFERRED EMBODIMENT

Figure 1:
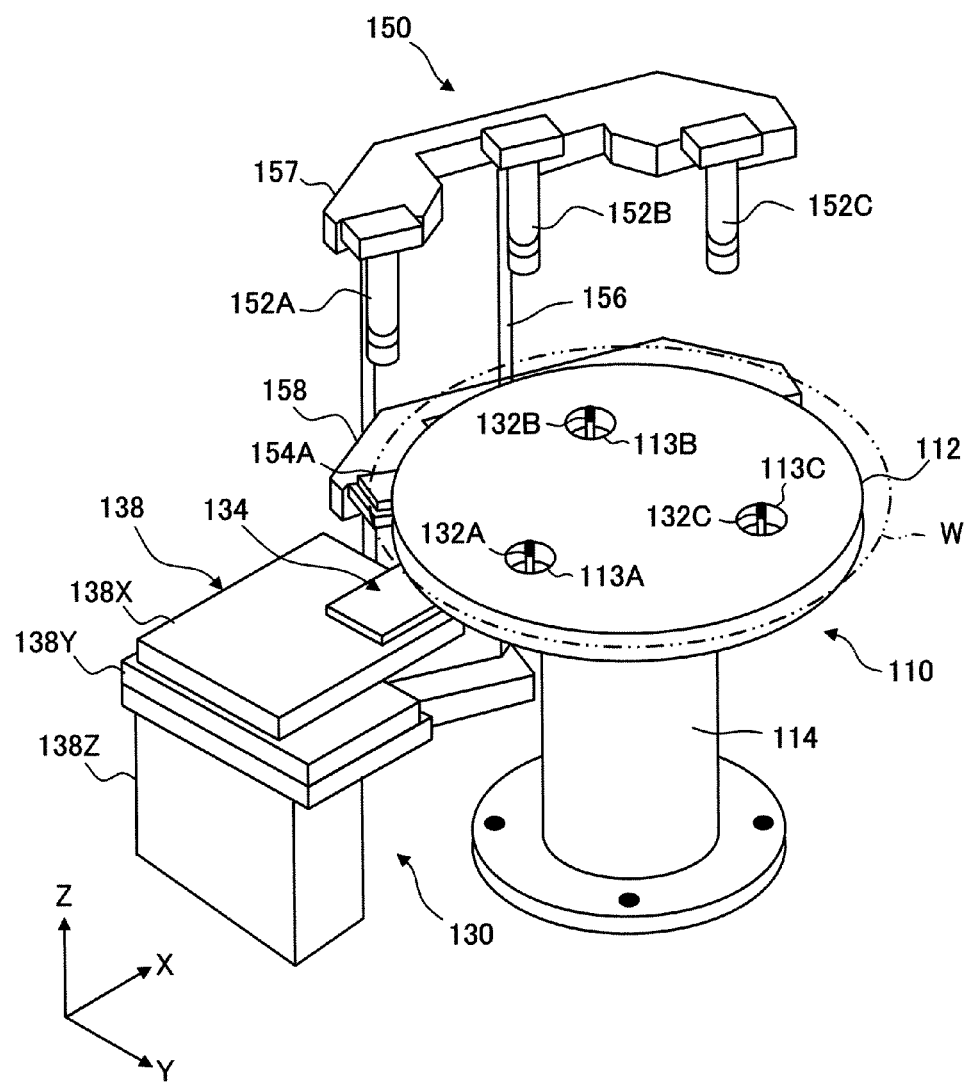
FIG. 1 is a perspective illustrating the substrate transfer device, the substrate position detection unit and the stage unit achieved in an embodiment of the present invention.

The following is a detailed explanation of the preferred embodiment of the present invention, given in reference to the attached drawings. It is to be noted that in the description and the drawings, the same reference numerals are assigned to structural elements having substantially identical functions and structural features to preclude the necessity for a repeated explanation thereof.

(Substrate Transfer Device)

Figure 2:
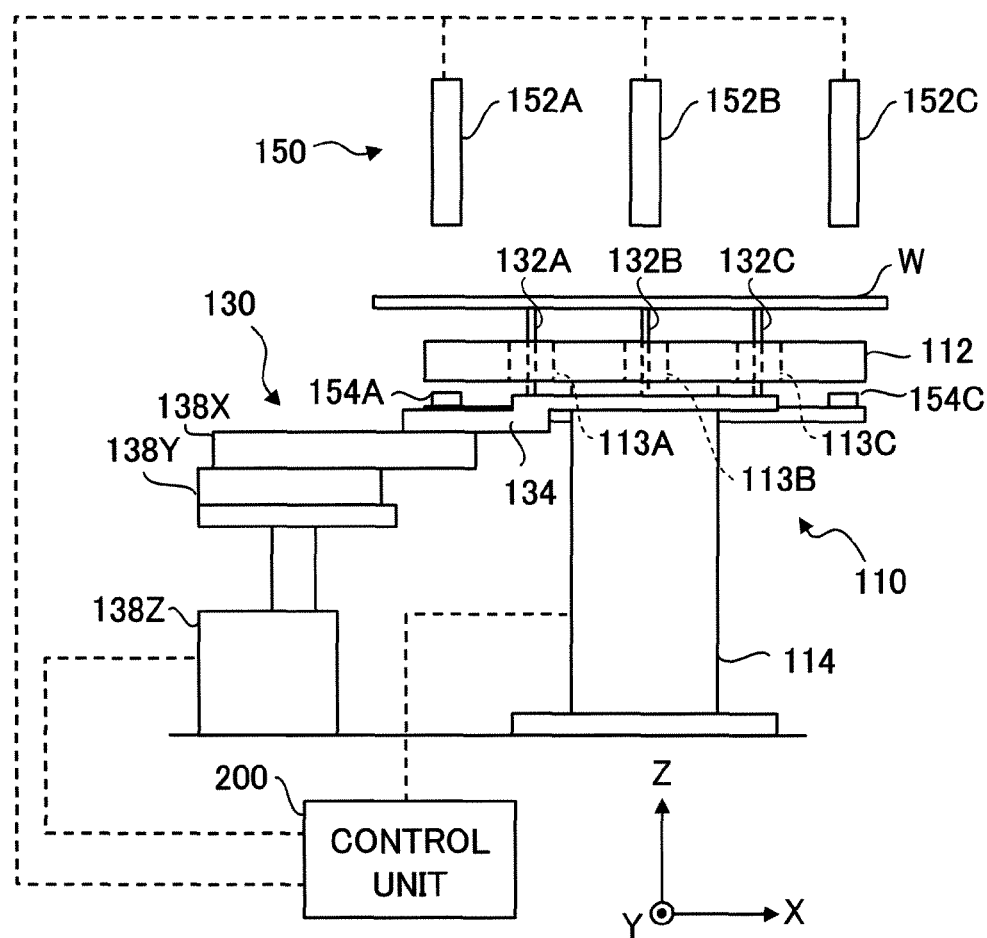
FIG. 2 is a side elevation showing the individual devices in FIG. 1 in profile.

First, the substrate transfer device achieved in the embodiment of the present invention is explained in reference to drawings. FIG. 1 is a perspective illustrating how various devices may be installed and FIG. 2 shows the devices in FIG. 1 in a side elevation. In reference to the embodiment, a substrate transfer device 130, which transfers a substrate such as a semiconductor wafer (hereafter may be simply referred to as a "wafer") W between a transfer arm (not shown) and a stage 112, is described.

As shown in FIGS. 1 and 2, the substrate transfer device (lifter unit) 130 achieved in the embodiment is installed near a stage unit 110 equipped with a stage 112 on which the wafer W is placed. In addition, a substrate position detection unit 150 that detects the position of the wafer W is installed near the stage unit 110.

The stage 112 assumes a disk shape with the radius thereof set smaller than the radius of the wafer W, as shown in FIG. 1. The wafer W is placed on the placement surface which is the top surface of the stage 112. The stage 112 is attached at the bottom surface of, for instance, a processing chamber via a support shaft 114 by using fastening members such as bolts. It is to be noted that the stage 112 may be a rotary stage. If the stage 112 is a rotary stage, a stepping motor may be installed, for instance, inside the support shaft 114 so as to rotate the stage 112 by driving the stepping motor. In addition, the wafer W placed on the placement surface of the stage 112 may be vacuum-held on the placement surface through, for instance, a vacuum chuck function. The wafer W held fast on the placement surface in this manner does not fall off the stage 112 even when it rotates at high speed. As shown in FIG. 2, the stage unit 110 is connected to a control unit 200 and the rotation of the stage 112 is controlled based upon a control signal provided by the control unit 200.

Figure 3:
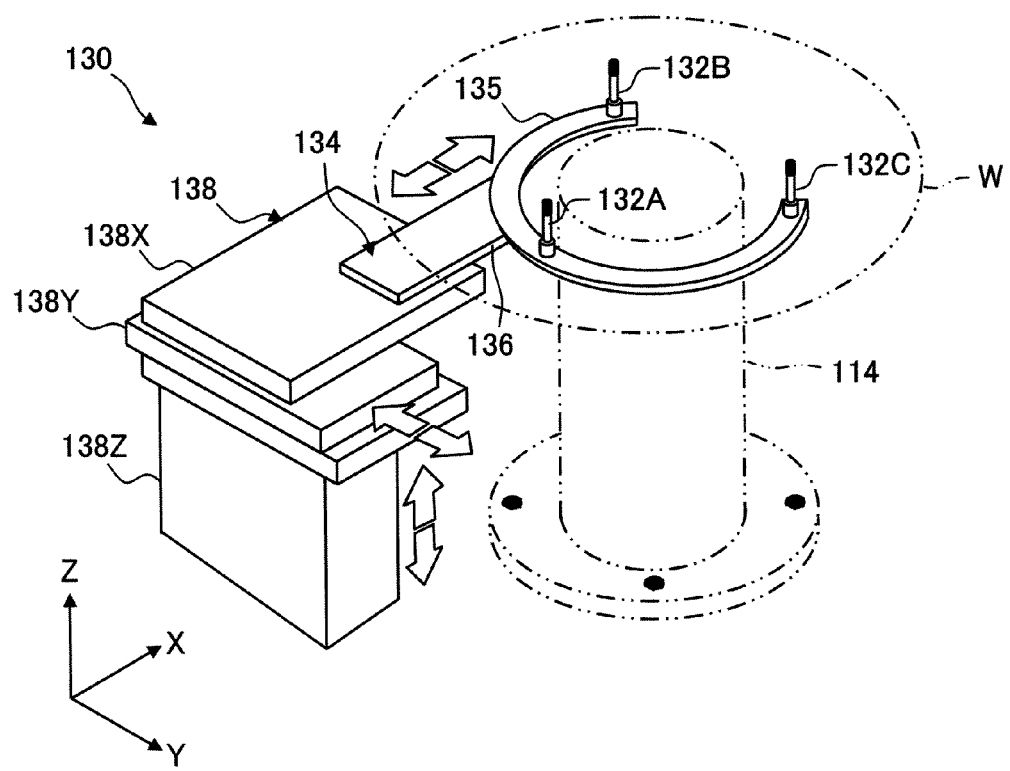
FIG. 3 is a perspective illustrating the structure adopted in the substrate transfer device shown in FIG. 1.

Now, the structure adopted in the substrate transfer device 130 is explained in detail in reference to FIGS. 1 and 3. FIG. 3 provides an illustration of the substrate transfer device alone among the devices shown in FIG. 1. It is to be noted that FIG. 3 does not include an illustration of the stage 112 and indicates the support shaft 114 of the stage 112 by a 2-point chain line, so as to facilitate a better understanding of the structure adopted in the substrate transfer device.

As shown in FIG. 3, the substrate transfer device 130 includes a plurality of (e.g., 3) support pins (lifter pins) 132A~132C which support the wafer W being transferred between the transfer arm (not shown) and the stage 112. These support pins 132A~132C are disposed around the support shaft 114 of the stage 112 at positions set apart from one another, as shown in FIG. 3. It is desirable that the support pins 132A~132C be disposed over equal intervals around the support shaft 114 so as to support the wafer W in a stable manner. In addition, while the quantity of the support pins is not limited to 3, it is desirable that there be at least three support pins in order to assure stable support for the wafer.

The support pins 132A~132C project upright at a base (lifter base) 134, and the support pins 132A~132C can be caused to move along the vertical direction or the horizontal direction all at once via the base 134. The base 134 may include, for instance, a substantially ring-shaped mounting plate 135 and a support plate 136 supporting the mounting plate 135, as shown in FIG. 3. On the top surface of the mounting plate 135, the support pins 132A~132C are disposed over specific intervals (e.g., equal intervals) along the circumference of the ring shape, whereas the support plate 136 is mounted at a stage constituting an X-direction drive means 138X of a support pin drive mechanism 138 to be detailed later.

It is to be noted that an opening large enough to allow the mounting plate 135 to be inserted through the side surface of the support shaft 114 is formed over part of the ring-shaped mounting plate 135. Thus, the substrate transfer device 130 can be installed so as to position the support pins 132A~132C around the support shaft 114 by fitting the mounting plate 135 around the support shaft 114 through the opening even after the support shaft 114 is locked onto the bottom surface of the processing chamber.

The base 134 is attached to the support pin drive mechanism 138 capable of driving the support pins 132A~132C along the horizontal direction as well as along the vertical direction. More specifically, the support pin drive mechanism 138 may include, for instance, the X-direction drive means 138X for driving the support pins 132A~132C along the X direction via the base 134 and a Y-direction drive means 138Y for driving the support pins along the Y direction. The X-direction drive means 138X may be constituted with, for instance, a stage capable of linear drive along the X direction, whereas the Y-direction drive means 138Y may be constituted with a stage capable of linearly driving the X-direction drive means along the Y direction running perpendicular to the X direction. It is to be noted that the X-direction drive means 138X and the Y-direction drive means 138Y together constitute a horizontal-direction (XY direction) drive means.

In addition, the support pin drive mechanism 138 includes a Z-direction drive means 138Z constituting a vertical-direction drive means capable of driving the support pins 132A~132C along the Z direction (up/down direction) via the base 134. The Z-direction drive means 138Z may be a stage capable of linearly driving the X-direction drive means 138X and the Y-direction 138Y up/down.

It is desirable to use, for instance, linear actuators in conjunction with these drive means 138X, 138Y and 138Z. The use of linear actuators will assure a high level of repositioning accuracy of several μm or less and allows the stages to be driven at high speed. It is to be noted that instead of linear actuators, each stage may be driven by a mechanism that includes a ballscrew and a stepping motor working in combination. It is to be noted that the substrate transfer device 130 is connected to the control unit 200, as shown in FIG. 2, and the drive of the individual drive means 138X, 138Y and 138Z is controlled based upon control signals provided by the control unit 200.

As the Z-direction drive means 138Z in this support pin drive mechanism 138 drives the support pins 132A~132C up/down via the base 134, the wafer W can be lifted toward the transfer arm or lowered onto the stage 112. In addition, as the X-direction drive means 138X and the Y-direction drive means 138Y drive the support pins 132A~132C along the horizontal direction (the XY directions) via the base 134, the position of the wafer W held on the support pins 132A~132C can be adjusted along the horizontal direction.

Thus, once the wafer W is transferred onto the support pins 132A~132C from the transfer arm, any wafer misalignment can be corrected simply by driving the support pins 132A~132C, holding the wafer W thereupon, along the horizontal direction without engaging the transfer arm or the transfer robot in operation, so as to improve the wafer processing throughput.

When the stage 112 onto which the wafer is placed has a relatively large diameter, as shown in FIG. 1, the support pins 132A~132C should be disposed at positions further inward relative to the radius of the stage 112. In addition, the support pins 132A~132C should assume a structure that allows their front ends to project out beyond and retract under the placement surface of the stage 112 via through holes formed at the stage 112. For instance, through holes 113A~113C through which the support pins 132A~132C respectively pass may be formed at the stage 112 as shown in FIG. 1.

This structure allows the front ends of the support pins 132A~132C to project out or retract through the through holes 113A~113C as the Z-direction drive means 138Z drives the support pins 132A~132C up/down. In addition, as the X-direction drive means 138X and the Y-direction drive means 138Y drive the support pins 132A~132C along the horizontal direction (XY drive), the support pins 132A~132C can be displaced within the through holes 113A~113C along the horizontal direction (XY drive) while their front ends remain projecting out beyond the placement surface of the stage 112 via the through holes 113A~113C respectively.

This structure makes it possible to support the wafer at points closer to the wafer center via the individual support pins 132A~132C and thus, the wafer is supported at points distanced from the processing target area while executing processing over the edge of the wafer placed on the stage 112 (e.g., cleaning processing to be detailed later).

It is desirable to set the diameter of the openings at the through holes 113A~113C in correspondence to, for instance, the diameter of the support pins 132A~132C and the extent to which they are to be allowed to move along the horizontal direction (e.g., the horizontal positioning-enabled range). For instance, the diameter of the through holes 113A~113C may be set to 10~20 mm.

If the stage 112 is allowed to rotate freely, the support pins 132A~132C should be lowered so as to ensure that the front ends of the support pins 132A~132C are retracted under the bottom surface of the stage 112 while the stage is rotated. By lowering the support pins 132A~132C in this manner, it is ensured that the through holes 113A~113C and the support pins 132A~132C do not collide with each other while the stage rotates.

Furthermore, while an explanation is given in reference to the embodiment on an example in which a single support pin is inserted at each through whole in the stage, the present invention is not limited to this example and a plurality of support pins may be inserted together through each of the plurality of through holes in the stage in a substrate transfer device with a greater number of support pins.

(Substrate Position Detection Means)

Figure 4:
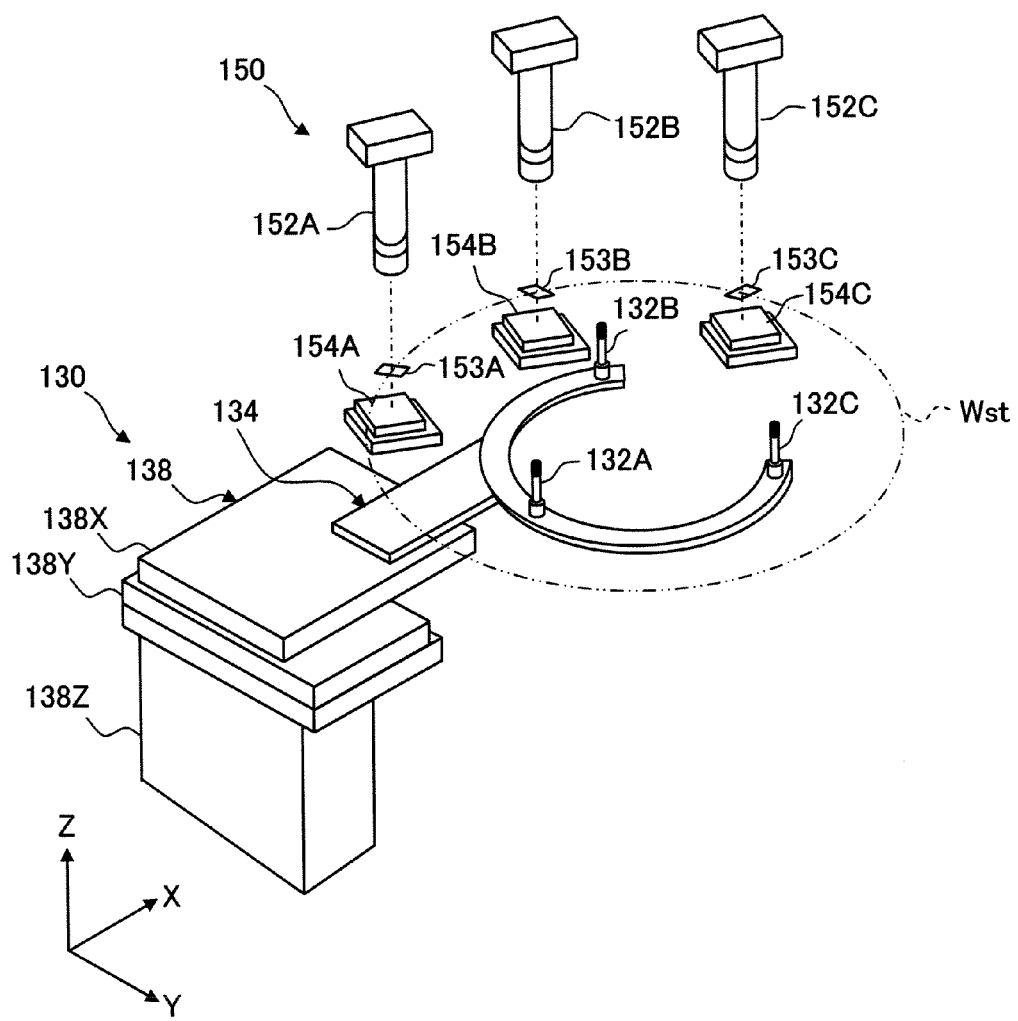
FIG. 4 is a perspective illustrating the structure adopted in the substrate position detection means in the substrate position detection unit in the embodiment.

The substrate position detection unit equipped with the substrate position detection means is now explained in reference to FIGS. 1 and 4. FIG. 4 is a perspective showing the structure adopted in the substrate position detection means. FIG. 4 does not include an illustration of the mounting base 156 or the stage 112 in FIG. 1 so as to facilitate a better understanding of the structure adopted in the substrate position detection means.

The substrate position detection unit 150 includes a substrate position detection means for detecting the position of the wafer W along the horizontal direction. The substrate position detection means is constituted with a plurality of (three in this example) image-capturing means 152A~152C for detecting the circumferential edge of the wafer W and illuminating light sources 154A~154C respectively disposed so as to face opposite the image-capturing means 152A~152C, as shown in FIG. 4.

The image-capturing means 152A~152C may each be constituted with, for instance, a CCD camera equipped with a CCD (charge coupled device) image sensor, a focal adjustment lens and the like. The illuminating light sources 154A~154C may each be constituted with an LED unit. It is to be noted that the illuminating light sources 154A~154C each include a diffusion plate disposed at the light emitting plane thereof so as to emit light with uniform intensity over the entire light emitting plane.

The image-capturing means 152A~152C and the illuminating light sources 154A~154C constituting the substrate position detection means are mounted at an upright mounting base 156 such as that shown in FIG. 1. The mounting base 156 includes a bracket 157 extending along the horizontal direction from the top thereof and a bracket 158 extending along the horizontal direction below the bracket 157. The image-capturing means 152A~152C are mounted at the upper bracket 157, whereas the illuminating light sources 154A~154C are mounted at the lower bracket 157. The image-capturing means 152A~152C and the illuminating light sources 154A~154C are thus disposed above and below the wafer W so as to clamp the circumferential edge of the wafer W between them.

As shown in FIG. 4, the optical axes of the illuminating light sources 154A~154C are adjusted so as to extend toward the light receiving surfaces of the image-capturing means 152A~152C respectively. In addition, with the height of the wafer W received from the transfer arm by raising the support pins 132A~132C higher than the placement surface of the stage 112 designated as a receiving height and the position of the wafer W when the center of the wafer W and the center of the stage are aligned (the position of the wafer indicated by the 2-point chain line in FIG. 4) designated as a horizontal reference position Wst, the positions of the individual image-capturing means 152A~152C are each adjusted so as to focus on the edge of a wafer at the reference position Wst at the receiving height. Furthermore, the image-capturing means are adjusted so that the areas over which the edge of the wafer at the reference position can be detected are aligned with measurement fields 153A~153C of the image-capturing means 152A~152C respectively.

Figure 5A:
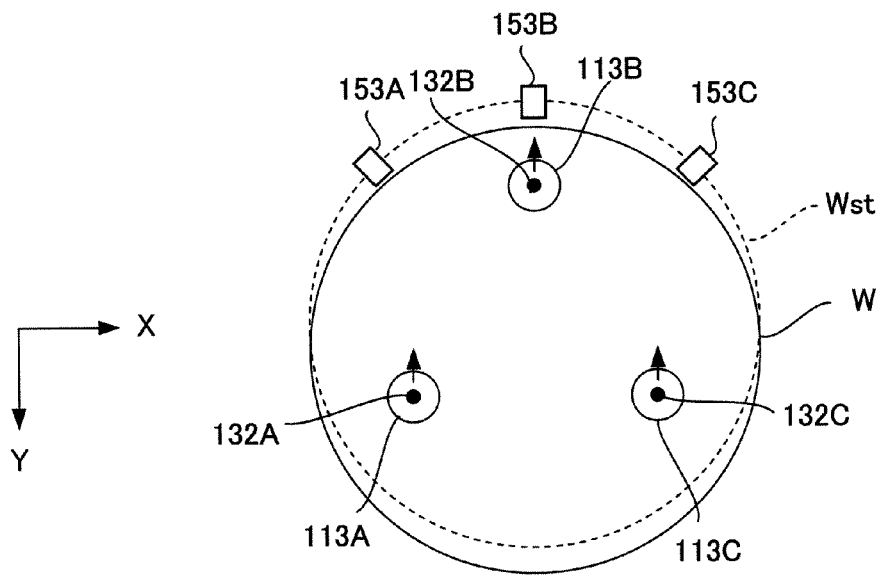
FIG. 5A illustrates the relationship between the states in the individual measurement fields and the position of the wafer W, which may be observed when the measurement fields are all judged to be in a white state (light state)

More specifically, the measurement fields 153A~153C of the image-capturing means 152A~152C are set over equal intervals along the circumferential edge of the wafer at the reference position Wst, as shown in FIG. 5A to be referenced later. For instance, in terms of the angles measured from the center of the wafer set at the reference position Wst, the angles between the measurement fields 153A and 153B and between the measurement fields 153B and 153C are each set to 45° and the angle between the measurement fields 153A and 153C is set to 90°. The angle settings assumed for the measurement fields 153A~153C are not limited to those described above and they can be altered freely by adjusting the mounting positions of the image-capturing means 152A~152C.

The image-capturing means 152A~152C are each connected to the control unit 200 as shown in FIG. 2 so as to transmit the data of images captured by the image-capturing means 152A~152C to the control unit 200, which controls the various components of the substrate transfer device 130 and the like. Based upon the image data output by capturing images over the measurement fields 153A~153C with the respective image-capturing means 152A~152C, the control unit 200 detects the edge of the wafer W.

For instance, as the edge of the wafer W moves into the measurement field 153A, the area where the wafer W is present in the measurement field 153A becomes dark since the area becomes shielded from the light originating at the illuminating light source 154A, while the rest of the area in the measurement field remains light. Thus, the presence of the edge of the wafer W in the measurement field 153A is detected. Accordingly, this state is referred to as an edge-present state (gray state) which is to be distinguished from a white state in which the entire measurement field is light and the black state in which the entire measurement field is dark.

In addition, since the boundary of the light area and the dark area in the measurement field 153A indicates the outline of the edge of the wafer W (e.g., a circular arc outline if the wafer is disk shaped as in the embodiment), the outline of the edge of the wafer W can be detected from the image output from the measurement field 153A.

Based upon the outline of the edge of the wafer W thus detected, the control unit 200 determines through calculation the position of the center of the wafer W. Then, in correspondence to the center of the stage 112 (the rotational center if the stage 112 is a rotary stage), the control unit determines the extent of horizontal misalignment of the wafer W and the specific direction along which the wafer W is misaligned. Subsequently, it drives the X-direction drive means 138X and the Y-direction drive means 138Y in correspondence to the misalignment extent and the misalignment direction so as to adjust the position of the wafer W along the horizontal direction by driving the support pins 132A ~132C along the horizontal direction.

It is to be noted that the extent and direction of horizontal misalignment of the wafer W may instead be determined by comparing the image data output for purposes of wafer position detection from the measurement fields 153A~153C with reference image data, which are constituted with image data output from the measurement fields 153A~153C by capturing images of the edge of a wafer W assuming the reference position Wst and are stored in advance. For instance, assuming that the wafer W is misaligned relative to the reference positioned Wst and the position of the edge of the wafer W indicated in the image data output from the measurement field 153A is thus offset, the ratio of the light area and the dark area (light/dark ratio) in the image data output from the measurement field 153A under such circumstances is different from the ratio measured when the wafer W assumes the reference position Wst. Accordingly, any misalignment of the target wafer W can be detected by comparing the light/dark ratio measured for the target wafer W with the light/dark ratio of the wafer assuming the reference positioned Wst and the extent and the specific direction of the misalignment can also be determined in correspondence to the light/dark ratio.

Then, by driving the support pins 132A~132C in correspondence to the extent and direction of the misalignment so as to match the light/dark ratio in the measurement field 153A with the ratio achieved when the wafer assumes the reference position Wst, the position of the wafer W along the horizontal direction can be adjusted.

Alternatively, the pattern (reference pattern) of the edge outline of the accurately aligned wafer W may be stored in advance into a storage means and a decision may be made as to whether or not the target wafer W is misaligned by comparing the pattern of the edge of the wafer W having been detected with the reference pattern to determine through calculation a specific direction and the extent of misalignment based upon the difference between the edge outline pattern of the wafer W and the reference pattern.

In a substrate transfer device such as the substrate transfer device 130 achieved in the embodiment that receives the wafer W onto the support pins in the raised state, the wafer W may become misaligned to a greater extent compared to the extent of misalignment of a wafer W transferred via a transfer member which regulates the position of the wafer W on an arm such as a transfer arm that lifts the wafer W by hooking the edge of the wafer W from above.

Under certain circumstances, the wafer W may be misaligned to such a great extent that the circumferential edge of the wafer W cannot be detected in the image data output from any of the measurement fields 153A~153C. More specifically, the entire measurement fields may be rendered as light areas (the measurement fields are judged to be in the white state (or the light state) in this case) or the entire measurement fields may be rendered as dark areas (the measurement fields are judged to be in the black state (or the dark state) in this case). In either case, the circumferential edge of the wafer W cannot be detected. Since the position of the wafer W cannot be detected, the extent of misalignment cannot be ascertained either and thus, the wafer misalignment cannot be corrected.

The relationship between the black/white judgment (light/dark judgment) made with regard to the states of the measurement fields and the wafer position is now explained. For instance, when a given measurement field is judged to be in the white state (the entire measurement field is rendered as a light area), it is assumed that the wafer W is not present in the particular measurement field. If the wafer is present on the support pins 132A~132C under these circumstances, the likelihood of the center of the wafer W being greatly misaligned with respect to the measurement field toward the center of the wafer assuming the reference position Wst (the reference center) is high. If, on the other hand, a given measurement field is judged to be in the black state (the entire measurement field is rendered as a dark area), the likelihood of the center of the wafer W present in the measurement field being greatly misaligned from the wafer assuming the reference position Wst toward the particular measurement field is high.

Accordingly, if a given measurement field is judged to be in the white state, the misalignment of the wafer can be corrected by horizontally driving the support pins 132A~132C so as to move them closer toward the center of the wafer assuming the reference position Wst from the measurement field. If, on the other hand, a given measurement field is judged to be in the black state, the misalignment of the wafer W can be corrected by horizontally driving the support pins 132A~132C so as to move them further away from the center of the wafer assuming the reference positioned Wst toward the measurement field. In addition, if the white/black judgment is made for a plurality of measurement fields, the direction of the misalignment can be estimated based upon the specific combination of white/black states indicated in the judgment results. Accordingly, by determining the direction along which the misalignment is to be corrected based upon the particular combination of white/black states indicated in the judgment results, the wafer misalignment can be adjusted. As a result, even when the wafer position cannot be detected, the wafer position can be adjusted along a direction along which the misalignment can be roughly corrected.

Figure 5B:
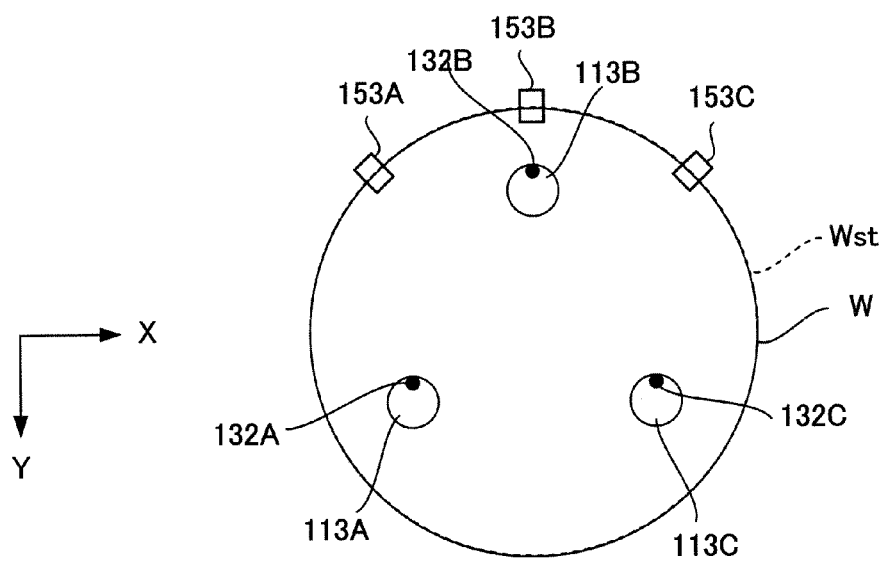
FIG. 5B shows the positional relationship between the support pins and the wafer, which may be observed after the misalignment shown in FIG. 5A is corrected.

For instance, if the measurement fields 153A~153C are all judged to be in the white state, as shown in FIG. 5A, the center of the wafer W is greatly misaligned along the direction moving further away from all the measurement fields 153A~153C (along the +Y direction in this example). Under these circumstances, the misalignment of the wafer W can be corrected as shown in FIG. 5B by horizontally driving the support pins 132A~132C along the direction in which the center of the wafer W moves closer to all the measurement fields 153A~153C, i.e., the direction determined by integrating the directions (directional vectors) extending from the center of the wafer assuming the reference position Wst toward the individual measurement fields 153A~153C (the −Y direction in this example). It is to be noted that although not shown, if the measurement fields 153A~153C are all judged to be in the black state, the wafer misalignment can be corrected by horizontally driving the support pins 132A~132C along the direction in which the center of the wafer W moves further away from all the measurement fields 153A~153C, i.e., the direction determined by integrating the directions extending from the individual measurement fields 153A~153C toward the center of the wafer at the reference positioned Wst (the +Y direction in this example).

Figure 6A:
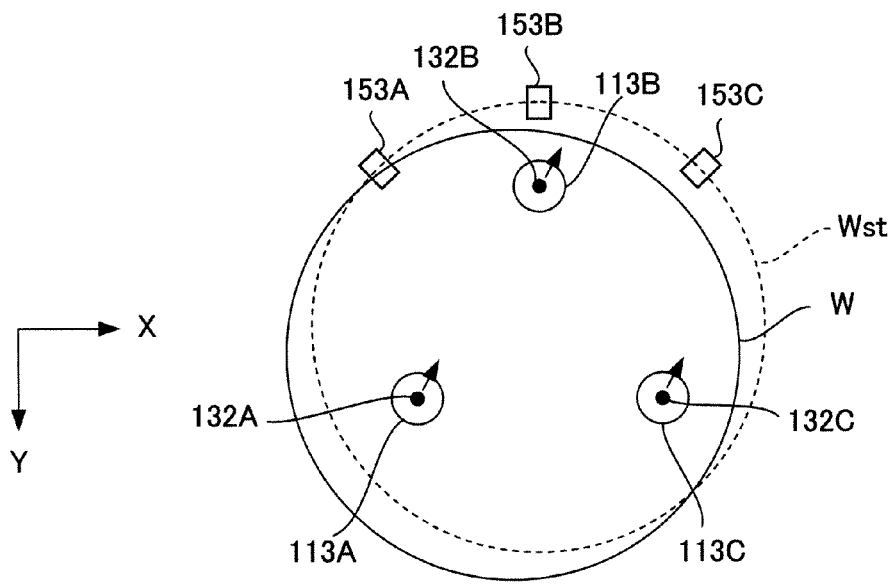
FIG. 6A illustrates the relationship between the states in the individual measurement fields and the position of the wafer W, which may be observed when one of the measurement fields is judged to be in a gray state and the other measurement fields are judged to be in a white state (light state)
Figure 6B:
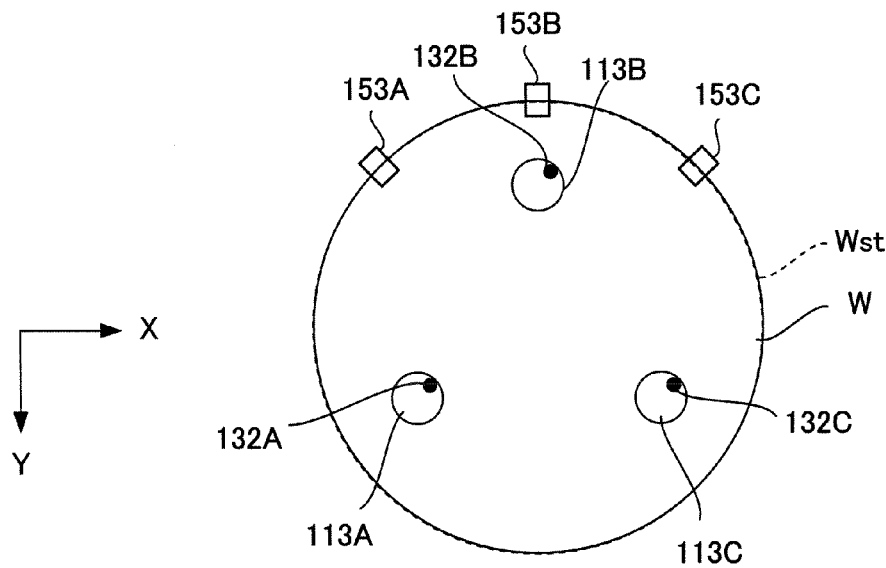
FIG. 6B shows the positional relationship between the support pins and the wafer, which may be observed after the misalignment shown in FIG. 6A is corrected.

For instance, if the circumferential edge of the wafer W cannot be detected in the measurement fields 153B and 153C and the measurement fields 153B and 153C are both judged to be in the white state while the wafer W is detected in the measurement field 153A, as shown in FIG. 6A, the center of the wafer W is greatly misaligned along the direction moving further away from the measurement fields 153B and 153C. In this case, the misalignment of the wafer W can be corrected by horizontally driving the support pins 132A~132C along the direction in which the center of the wafer W moves away from the measurement fields 153B and 153C, i.e., along the direction determined by integrating the directions extending from the center of the wafer assuming the reference position Wst toward the measurement fields 153B and 153C, as shown in FIG. 6B.

Figure 7A:
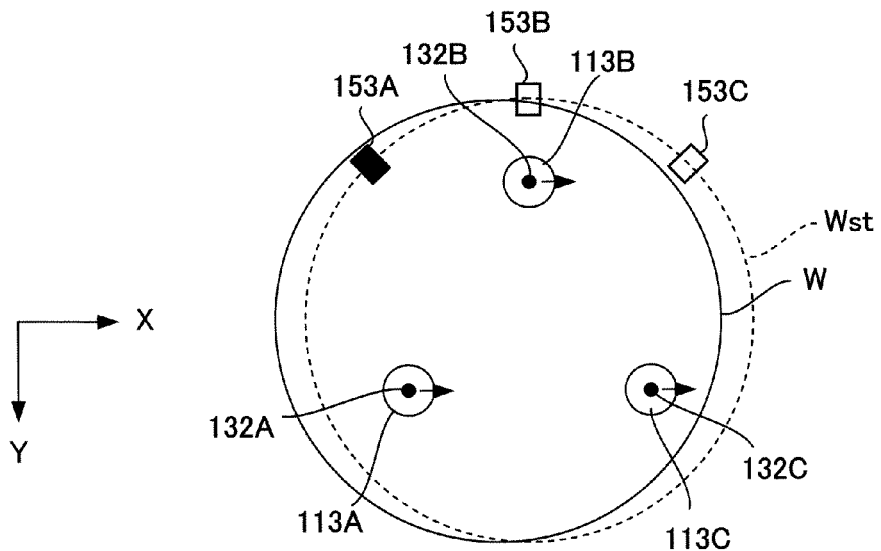
FIG. 7A illustrates the relationship between the states in the individual measurement fields and the position of the wafer W, which may be observed when one of the measurement fields is judged to be in a gray state and one of the other measurement fields is judged to be in a black state (dark state) and the last measurement field is judged to be in a white state (light state)
Figure 7B:
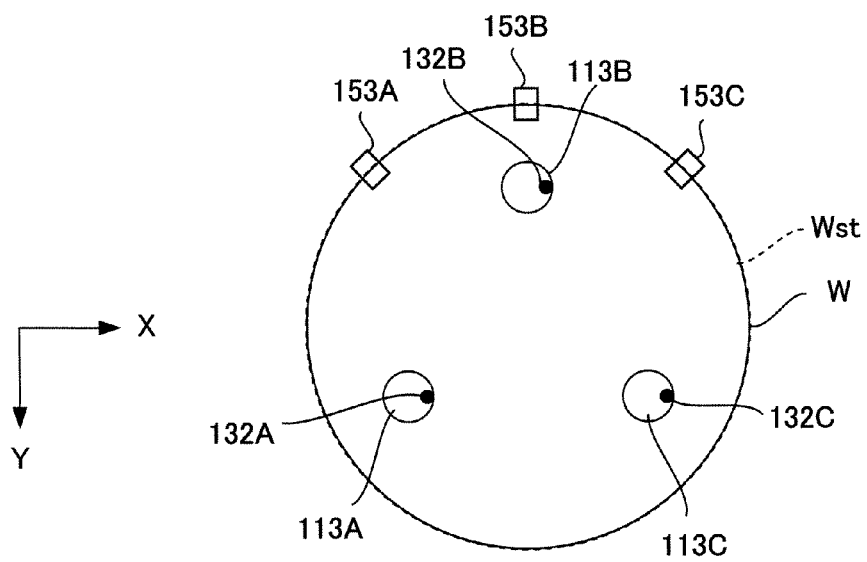
FIG. 7B shows the positional relationship between the support pins and the wafer, which may be observed after the misalignment shown in FIG. 7A is corrected.

If the circumferential edge of the wafer W cannot be detected in the measurement fields 153A and 153C, the measurement field 153A is judged to be in the black state and the measurement field 153C is judged to be in the white state while the circumferential edge of the wafer W is detected in the measurement field 153B as shown in FIG. 7A, the center of the wafer W is greatly misaligned along the direction moving toward the measurement field 153A but moving further away from the measurement field 153C (the −X direction in this example). Under these circumstances, the misalignment of the wafer W can be corrected by horizontally driving the support pins 132A~132C along the direction in which the center of the wafer W moves further away from the measurement field 153A and closer to the measurement field 153C, i.e., along the direction determined by integrating the direction extending from the measurement field 153A toward the center of the wafer assuming the reference positioned Wst and the direction from the center of the wafer assuming the reference position Wst toward the measurement field 153C (the +X direction in this example) as shown in FIG. 7B.

By judging the white/black states of the individual measurement fields, detecting the wafer misalignment based upon the white/black states thus determined and then correcting the wafer misalignment accordingly, as described above, the misalignment of the wafer can be corrected even when the wafer W is misaligned to such a great extent that the edge of the wafer cannot be detected. It is to be noted that the wafer W may be displaced in predetermined increments along the misalignment correcting direction determined through the white/black judgment until the edge of the wafer W is present in all the measurement fields 153A~153C and then the edge of the wafer W may be detected to ultimately detect the wafer position by determining the position of the center of the wafer. In this case, the position of the wafer W can be detected with an even higher level of accuracy even if the wafer W is misaligned to a great extent.

The various components of the stage unit 110, the substrate transfer device 130 and the substrate position detection unit 150 described above are all controlled by the control unit 200. The control unit 200 may be constituted with a CPU (central processing unit) constituting the control unit main body, a ROM (read only memory) in which data required by the CPU to execute processing are stored, a RAM (random access memory) which includes a memory area used by the CPU when it executes various types of data processing and the like, a storage means such as a hard disk (HDD) or a memory where the programs and the various data used when the CPU controls the various components are stored and the like.

(Wafer Transfer Processing)

Figure 8:
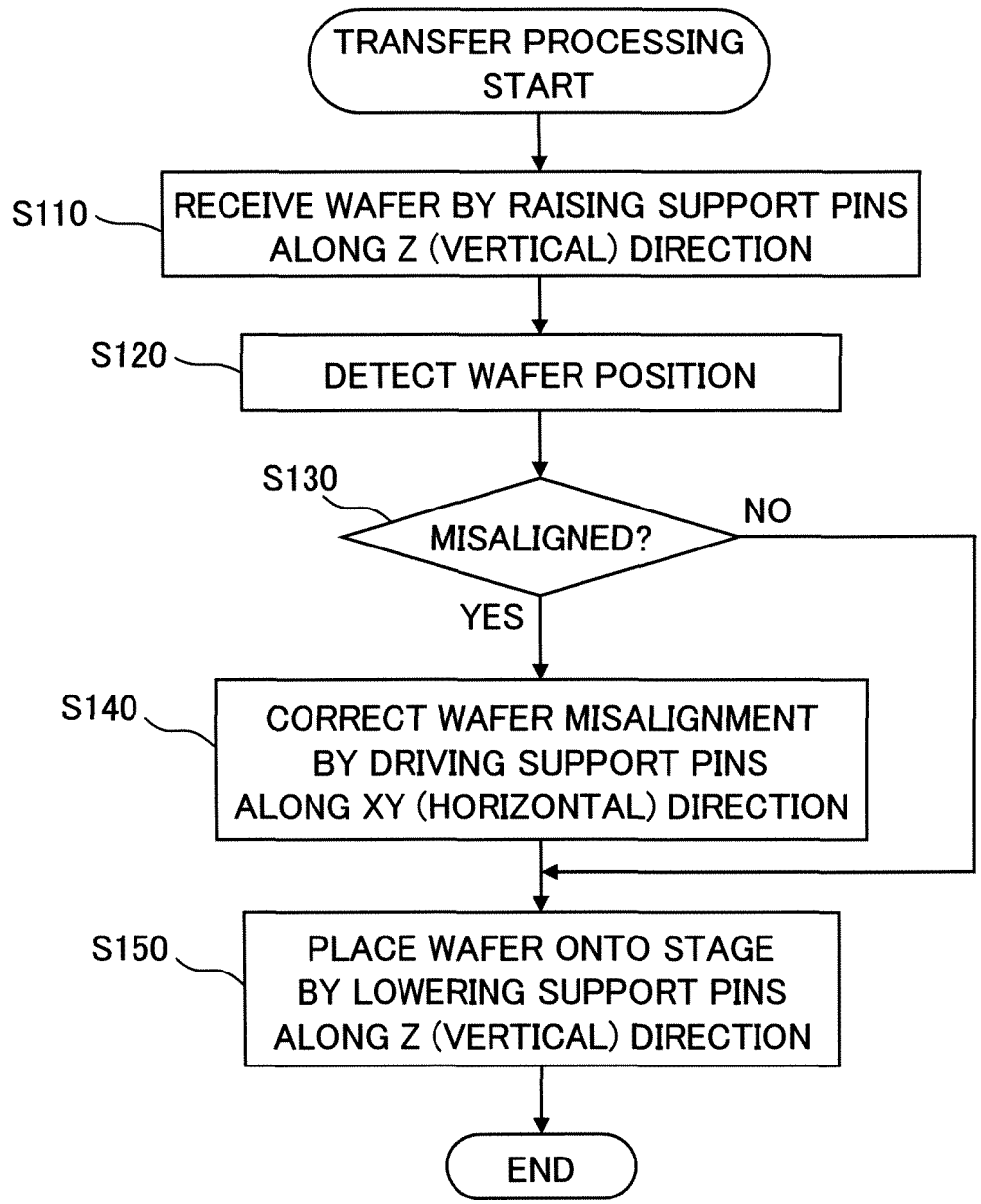
FIG. 8 presents a flowchart of a specific example of wafer transfer processing that may be executed in the embodiment.

Next, a specific example of the wafer transfer or processing executed with the substrate transfer device described above is explained in reference to drawings. The control unit 200 executes the transfer processing by controlling the various components of the substrate transfer device 130 and the substrate position detection unit 150 based upon a specific program read out from the storage means. FIG. 8 presents a flowchart of the specific example of the transfer processing executed when a wafer having been delivered on the transfer arm is placed onto the stage. FIGS. 9A~9E provide illustrations of an example of an operation executed in the substrate transfer device 130 during the wafer transfer processing. It is to be noted that Cw and Ct in FIGS. 9A~9E respectively indicate the center of the wafer W and the center of the wafer assuming the reference position Wst explained earlier.

Figure 9A:
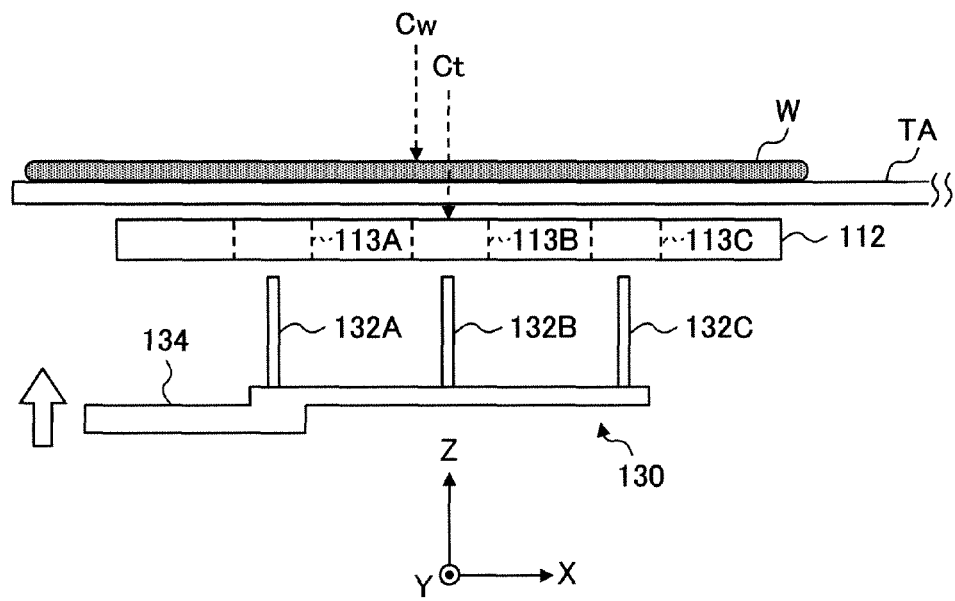
FIG. 9A~9E each provide an illustration in reference to which an example of the operation executed by the substrate transfer device is explained.
Figure 9B:
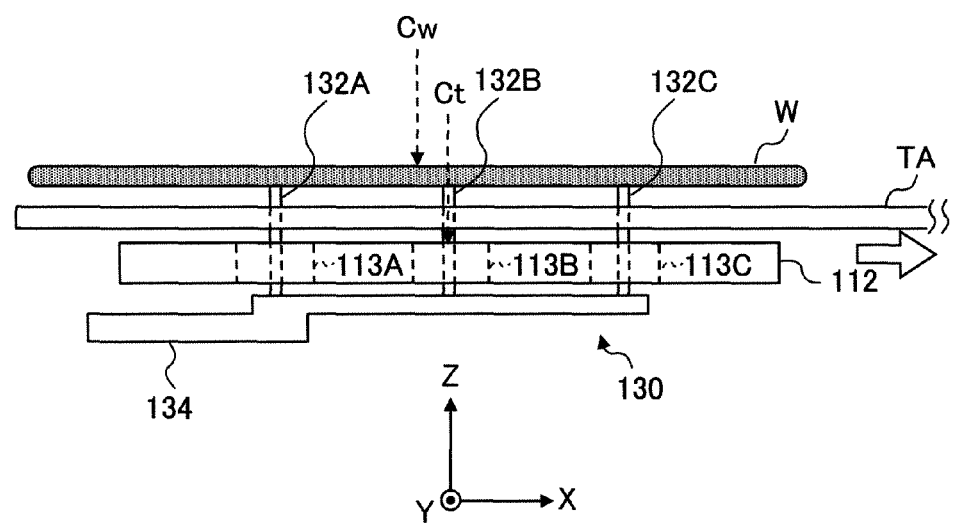
Figure 9C:
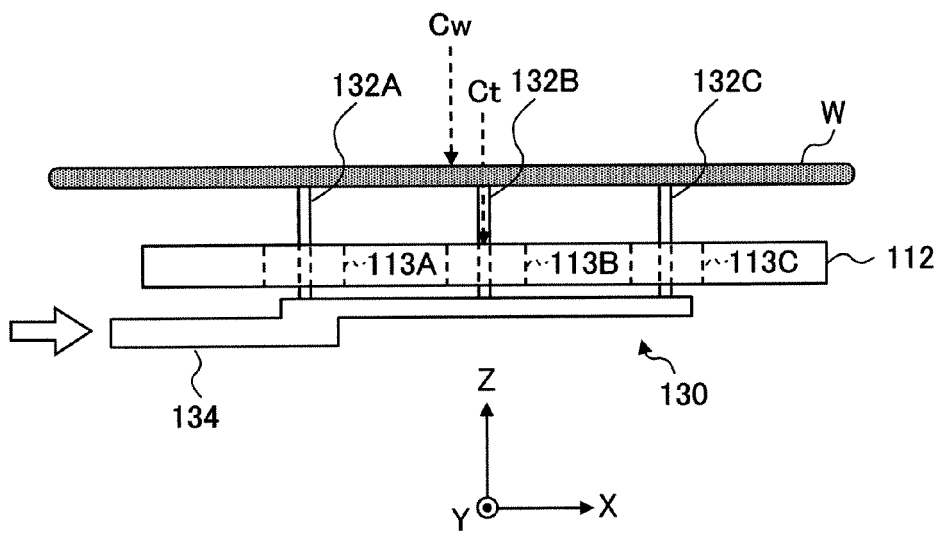

In order to transfer the wafer W on the transfer arm TA onto the stage 112, the support pins 132A~132C are first raised in step S110 to take the wafer W on the transfer arm TA onto the support pins, as shown in FIG. 8. More specifically, as the transfer arm TA carrying the wafer W is positioned above the stage 112, the Z-direction drive means 138Z is driven so as to raise the support pins 132A~132C along the Z (vertical) direction to a specific wafer receiving height, as shown in FIG. 9A. As the support pins 132A~132C are raised, their front ends pass through the respective through holes 113A~113C to project out above the placement surface of the stage 112 and the front ends keep moving further upward until the wafer W on the transfer arm TA is lifted up, as shown in FIG. 9B. Once the wafer W is taken onto the front ends of the support pins 132A~132C, the transfer arm TA moves away from the position above the stage 112, as shown in FIG. 9B and, as a result, the state shown in FIG. 9C is assumed.

While the support pins 132A~132C are raised to take the wafer W from the transfer arm TA onto the transfer pins 132A~132C in the embodiment as described above, the present invention is not limited to this example. For instance, if the transfer arm TA assumes a structure that allows it to move up/down, the transfer arm TA may be lowered to transfer the wafer W onto the front ends of the support pins 132A~132C. In this case, the Z-direction drive means 138Z is first driven to raise the support pins 132A~132C along the Z axis and then the transfer arm TA carrying the wafer W is positioned above the stage 112. Then, the transfer arm TA is lowered to ease the wafer onto the support pins 132A~132C. As a result, the wafer W can be transferred while the support pins 132A~132C remain in the raised state.

It is to be noted that if the wafer W is already misaligned along the horizontal direction (if the center Cw of the wafer W is already misaligned relative to the center (reference center) Ct of the wafer assuming the reference position Wst in this example) when the transfer arm TA is positioned above the stage 112 as shown in FIG. 9A, the wafer W in the misaligned state is lifted upward by the support pins 132A~132C.

Such a misalignment of the wafer W along the horizontal direction will be detected while the wafer W is held on the support pins 132A~132C and will be corrected by driving the support pins 132A~132C along the horizontal direction through the subsequent wafer positioning processing (steps S120~S140). Since this allows the transfer arm TA to start the next operation (e.g., the transfer of another wafer) immediately after transferring the wafer onto the support pins, the wafer processing throughput is improved.

In the wafer positioning processing, the position of the wafer W is detected with the substrate position detection unit 150 in step S120. In this step, the position assumed by the wafer W along the horizontal direction is detected while it is held on the support pins 132A~132C. In more specific terms, the position of the wafer W is detected as explained earlier based upon the image data output from the measurement fields 153A~153C by capturing images via the image-capturing means 152A~152C with the light emitted from the illuminating light sources 154A~154C. For instance, the center of the wafer W may be detected to represent the position of the wafer W based upon the outline of the circumferential edge of the wafer W detected in the output image data.

Next, a decision is made in step S130 as to whether or not the wafer W is misaligned. More specifically, the extent of misalignment of the wafer W manifesting along the horizontal direction is determined based upon the detected wafer position and, if the extent of misalignment is within a predetermined allowable misalignment range, the wafer W is judged to be aligned, whereas if the extent of the misalignment is outside the predetermined allowable misalignment range, the wafer W is judged to be misaligned.

For instance, when the center of the wafer W is detected to represent the position of the wafer W, the extent of deviation of the center of the wafer W relative to the center (reference center) of the wafer assuming the reference position Wst is calculated as the misalignment quantity representing the extent of misalignment of the wafer W. It is to be noted that the misalignment quantity may be calculated for the wafer W through a method other than that described above. For instance, the misalignment quantity may be calculated by comparing the ratio of the light area and the dark area (light/dark ratio) with the light/dark ratio of the wafer W assuming the reference position Wst, or the misalignment quantity may be calculated by comparing the pattern of the wafer edge outline with the pattern of the edge outline of the wafer assuming the reference position Wst.

Figure 9D:
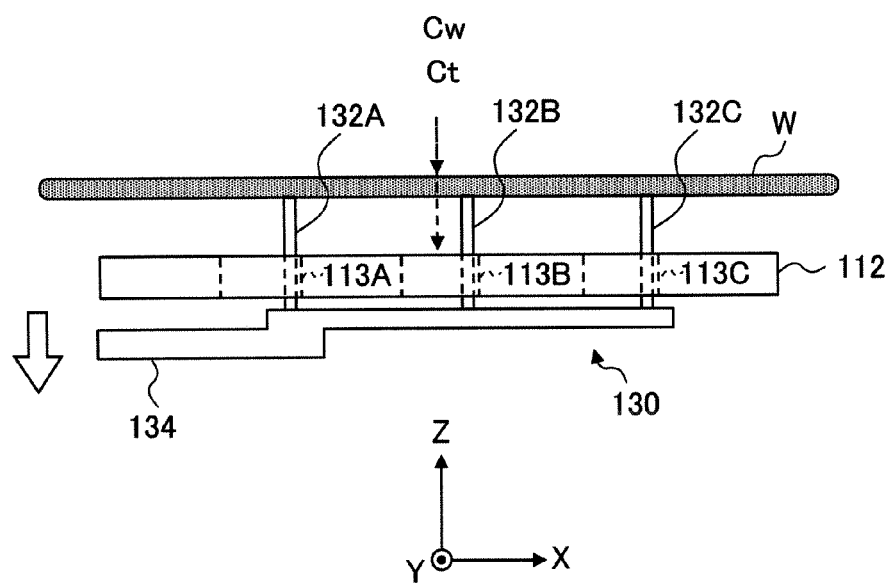
Figure 9E:
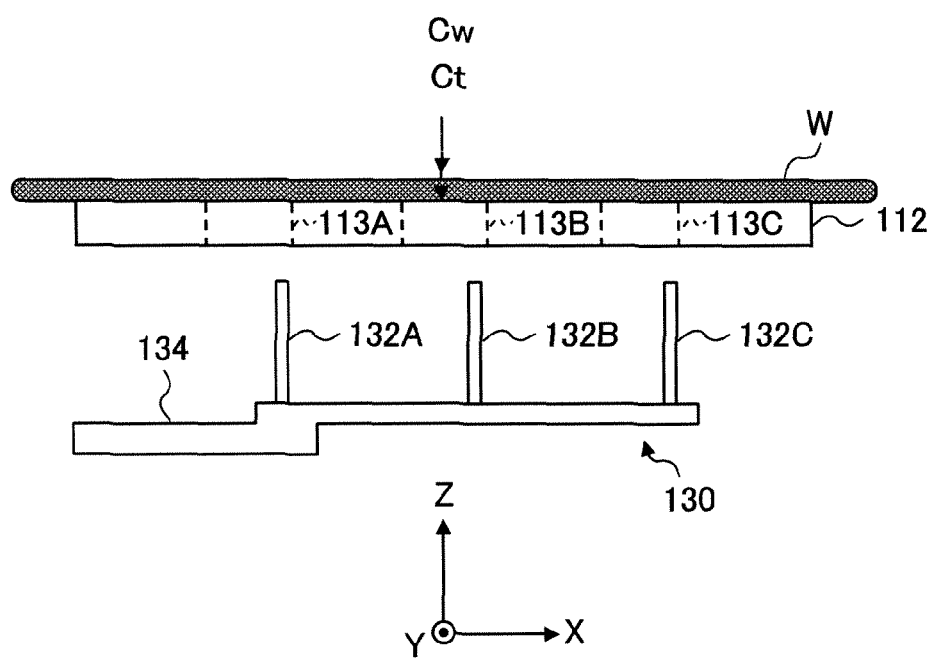

If it is decided in step S130 that the wafer W is not misaligned, the support pins 132A~132C are simply lowered to place the wafer W onto the stage 112 in step S150. If, on the other hand, the wafer W is judged to be misaligned, the X-direction drive means 138X and the Y-direction drive means 138Y are driven to drive the support pins 132A~132C along the horizontal direction for wafer position correction in step S140. For instance, if the wafer W is misaligned along the −X direction, as shown in FIG. 9C, the X-direction drive means 138X alone is driven to drive the support pins 132A~132C along the +X direction. As a result, the wafer W is positioned so as to align the center Cw of the wafer W with the center Ct of the wafer assuming the reference position Wst, as shown in FIG. 9D.

It is to be noted that when correcting the position of the wafer W, the extent and the direction of the misalignment of the wafer W may be first calculated and then the support pins 132A~132C may be driven along the horizontal direction in correspondence to the extent and the specific direction of the misalignment of the wafer W. Alternatively, the support pins 132A~132C may be driven in predetermined increments along the horizontal direction and the wafer W may be moved onto the reference position by detecting and verifying the position of the wafer W with the image-capturing means 152A~152C each time the support pins are driven by the predetermined extent.

Once the wafer positioning processing (steps S120 through S140) ends, the support pins 132A~132C are lowered to place the wafer W onto the stage 112 in step S150. In more specific terms, the Z-direction drive means 138Z is driven to lower the support pins 132A~132C to ease the wafer W onto the stage 112 as shown in FIG. 9D. As a result, the wafer W, with its position along the horizontal direction corrected, is placed on the stage 112. The wafer transfer processing then ends.

It is desirable that the front ends of the support pins 132A~132C be made to retreat to a position lower than the lower surface of the stage 112 through the through holes 113A~113C when the support pins 132A~132C are lowered, so as to prevent the support pins 132A~132C from obstructing the rotation of the stage 112.

In addition, if the wafer W is misaligned to such a great extent that the edge of the wafer W cannot be detected in the image data output in correspondence to the measurement fields 153A~153C in step S120 shown in FIG. 8, the misalignment of the wafer may be corrected in step S140 by determining the misalignment correcting direction in correspondence to the specific combination of the white/black states that the measurement fields 153A~153C are judged to be in, as explained earlier. In this case, even when the wafer W is misaligned to such a great extent that the wafer edge cannot be detected, the wafer misalignment can still be corrected. As a further alternative, the wafer edge may be detected in step S120 after driving the wafer W along the misalignment correcting direction determined based upon the results of the white/black judgment in predetermined increments until the edge of the wafer W moves into all the measurement fields 153A~153C and then the subsequent processing may be executed.

Furthermore, while the substrate transfer device 130 in the embodiment is utilized to transfer the wafer W from the transfer arm TA to the stage 112 through the processing shown in FIG. 8, the substrate transfer device 130 can also be utilized when transferring the wafer W from the stage 112 onto the transfer arm TA by lifting the wafer W up off the stage 112 on the support pins 132A~132C, detecting the position of the wafer W on the support pins and transferring the wafer W to the transfer arm TA after correcting the position of the wafer W. By utilizing the substrate transfer device in this process, the wafer W can be moved to a position at which it can be at least retrieved via the transfer arm TA when the wafer W is misaligned to such a great extent that its position cannot be corrected simply by driving the transfer pins 132A~132C along the horizontal direction.

As described above, the support pins 132A~132C are allowed to move along the horizontal direction (the XY directions) and thus, after the wafer W having been carried on the transfer arm TA is delivered onto the support pins 132A~132C, the support pins 132A~132C holding the wafer W can be driven along the horizontal direction without engaging the transfer arm TA in operation. As a result, the misalignment of the wafer W can be promptly corrected. In addition, the transfer arm TA can be immediately engaged in another operation (e.g., the transfer of another wafer) once it delivers the wafer onto the support pins 132A~132C. Consequently, the wafer processing throughput is improved.

In addition, since the wafer W is positioned along the horizontal direction via the X-direction drive means 138X and the Y-direction drive means 138Y achieving high resolution and capable of high-speed drive operation, the wafer W can be quickly placed on the placement surface of the stage 112 at the accurate position (reference position). As a result, the wafer processing throughput is further improved and, at the same time, the wafer W placed on the wafer placement surface of the stage 112 can be processed in a reliable and accurate manner.

Furthermore, the substrate transfer device 130, which is provided as a device independent of the stage unit 110 in the embodiment, is allowed to assume a simple structure. Since the substrate transfer device 130 can be installed in the processing chamber with a high level of freedom, it can be adopted in conjunction with various types of processing chambers. Moreover, since the stage unit 110 and the substrate transfer device 130 are provided as devices independent of each other, the stage 112 is allowed to rotate at high speed. The structure adopted in the substrate transfer device 130, which includes the X-direction drive means 138X and the Y-direction drive means 138Y for driving the support pins 132A~132C along the horizontal direction enables highly accurate positional correction of the wafer W.

In addition, the substrate transfer device 130 in the embodiment corrects any positional misalignment by driving the support pins 132A~132C along the horizontal direction instead of correcting the positional misalignment by driving the stage along the horizontal direction. Thus, even when the wafer W is misaligned to such a great extent that the wafer edge cannot be detected by the substrate position detection unit 150, the wafer W, held on the support pins 132A~132C, can be displaced along the horizontal direction to a position at which the substrate position detection unit 150 is able to detect the wafer W. As a result, even when the wafer W is misaligned to a great extent, the position of the wafer W can be detected and thus the misalignment can be quickly corrected.

The wafer W may be aligned by detecting an orientation flat, a notch or the like formed at the wafer W. The method, however, requires the wafer W to be rotated at least once. In contrast, the misalignment of the wafer W manifesting along the horizontal direction is detected in the embodiment by utilizing the image-capturing means 152A~152C, eliminating the need to rotate the wafer W. Consequently, the length of time required for misalignment detection is greatly reduced to result in an improvement in the wafer processing throughput.

In addition, after the wafer W is transferred from the transfer arm TA onto the support pins 132A~132C, the wafer positioning processing can be executed immediately to position the wafer W along the horizontal direction before it is placed onto the wafer placement surface of the stage 112, which reduces the length of time to elapse before the positioning processing is completed. As a result, the wafer processing throughput is improved.

Furthermore, the support pins 132A~132C in the substrate transfer device 130 achieved in the embodiment are driven by the Z-direction drive means 138Z to project or retract the front ends of the support pins 132A~132C through the through holes 113A~113C. While the support pins 132A~132C in the substrate transfer device 130 in the embodiment can be horizontally driven by the X-direction drive means 138X and the Y-direction drive means 138Y within the respective through holes 113A~113C while their front ends remain projecting out through the through holes 113A~113C beyond the placement surface of the stage 112, the present invention is not limited to this structural example.

Figure 10:
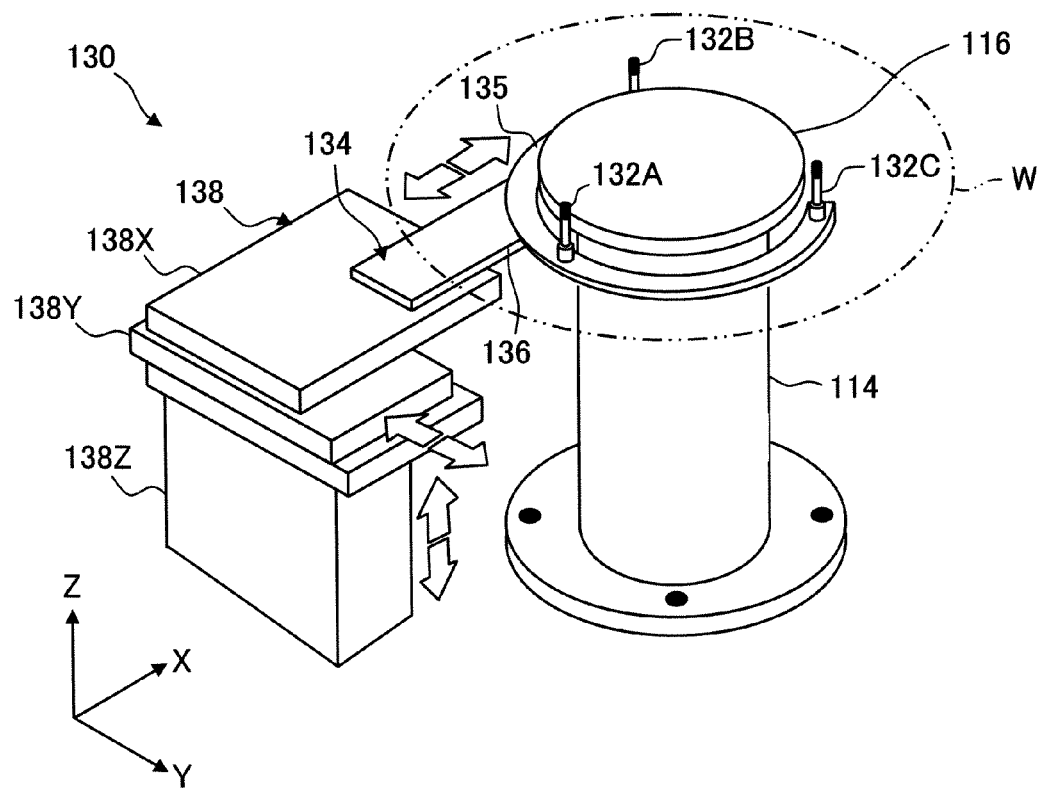
FIG. 10 is a perspective presenting another structural example that may be adopted in the substrate transfer device in the embodiment.

For instance, the support pins 132A~132C in the substrate transfer device 130 may be disposed around the support shaft 114 of the stage 116 at positions set apart from one another further outward relative to the radius of the stage 116, as shown in FIG. 10. This structure allows the substrate to be supported on the support pins without having to form through holes 113A~113C through which the support pins 132A~132C are to pass, at the stage 116. In addition, since the extent to which the support pins 132A~132C are driven along the horizontal direction is not restricted by the diameter of the through holes 113A~113C, the support pins 132A~132C can be displaced along the horizontal direction by a greater extent. Namely, the extent by which the wafer W is displaced along the horizontal direction at once, during wafer misalignment correction or wafer position adjustment can be increased.

It is to be noted that in the structure such as that shown in FIG. 10 with the support pins 132A~132C disposed further outside relative to the stage 116, the support pins will be set closer to the edge of the wafer W as the diameter of the stage increases. Accordingly, it is more desirable to assume a structure such as that shown in FIG. 1 with the support pins 132A~132C disposed further inward relative to the stage when the present invention is adopted in a processing chamber (e.g., a cleaning processing chamber 400) where the edge of the wafer W undergoes the processing.

Furthermore, while an explanation has been given in reference to the embodiment on an example in which misalignment of the wafer W manifesting along the horizontal direction is detected by using the three image-capturing means 152A~152C, the present invention is not limited to this example and the misalignment of the wafer W manifesting along the horizontal direction may be detected instead via a single image-capturing means or two image-capturing means. Moreover, instead of the image-capturing means 152A~152C constituted with CCD image sensors or CCD cameras, image-capturing means constituted with any of various types of photoelectric sensors, ultrasonic sensors and the like may be utilized. The support pins 132A~132C in the embodiment are mounted at the substantially ring-shaped mounting plate 135 at positions set apart from one another, as shown in FIG. 3, and for this reason, any misalignment of the wafer W tilts the mounting plate 135 to result in a change in the moment of the supporting plate 136. Accordingly, a moment sensor may be mounted at the supporting plate 136 to detect the wafer position or wafer misalignment based upon the change in the moment.

(Example of Application for the Substrate Transfer Device)

Figure 11:
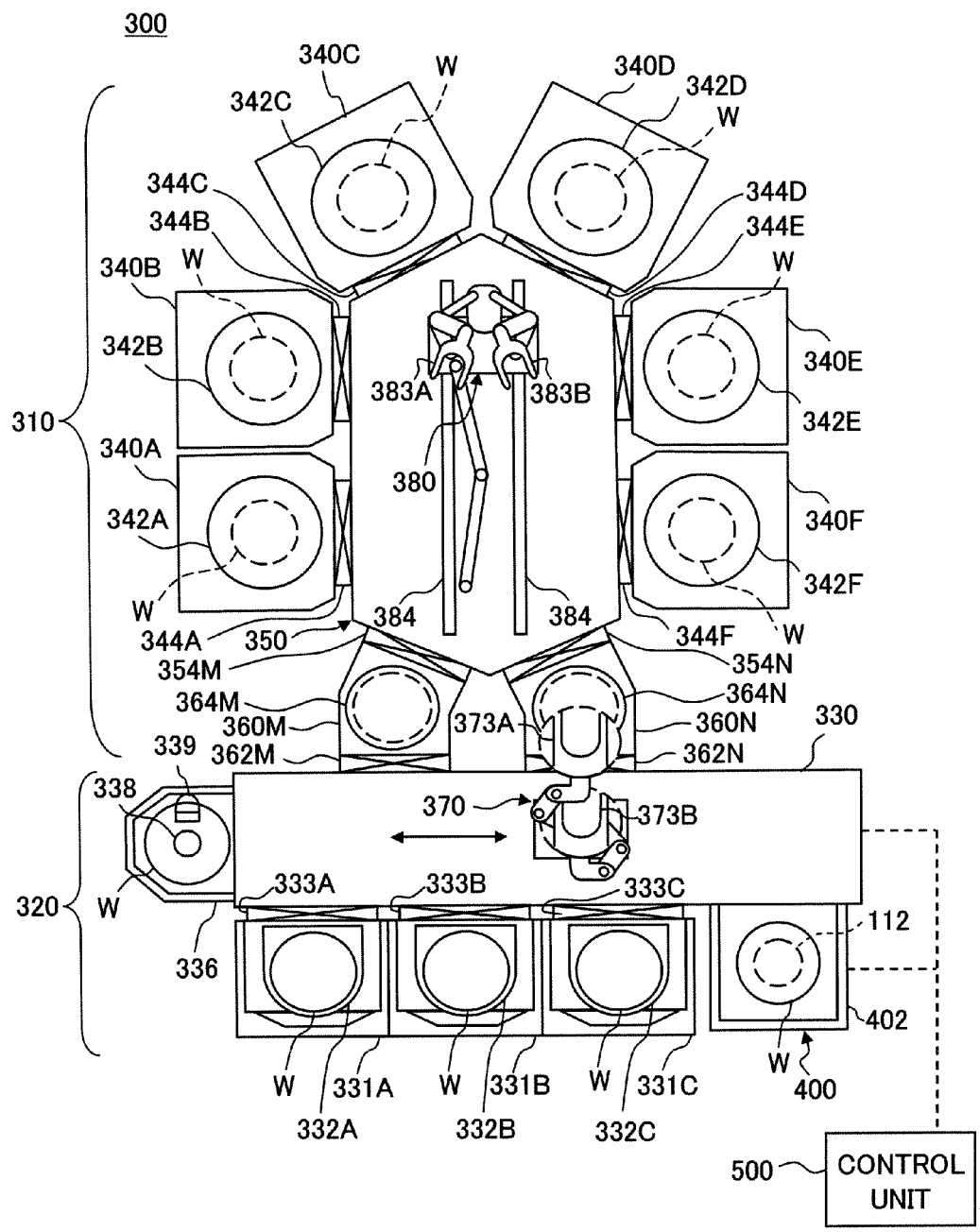
FIG. 11 is a sectional view showing a structural example of a substrate processing apparatus in which the substrate transfer device in the embodiment may be adopted.

Next, an example of a substrate processing apparatus in which the substrate transfer device described above may be adopted is explained in reference to drawings. FIG. 11 schematically shows in a sectional view the structure adopted in the substrate processing apparatus in the embodiment of the present invention.

A substrate processing apparatus 300 comprises a processing unit 310 that includes a plurality of processing chambers where various types of processing such as film formation processing and etching are executed on wafers W in a low pressure environment and a transfer unit 320 that carries a wafer W into/out of the processing unit 310.

First, an example of a structure that may be adopted in the transfer unit 320 is described. The transfer unit 320 includes a transfer chamber 330 through which a plurality of (e.g., 25) wafers W stored in each cassette container 332 are transferred within the substrate processing apparatus 300. Three cassette tables 331A~331C are installed corresponding to gate valves 333A~333C in the transfer chamber 330, and cassette containers 332A~332C can be set respectively on the cassette tables 331A~331C.

In addition, a pre-alignment processing chamber (orienter) 336 where a wafer W is pre-aligned prior to the processing and the cleaning processing chamber 400 representing an example of a post-processing chamber where any material having settled onto the wafer W is removed following the processing are disposed at the transfer chamber 330. A rotatable stage 338 and an optical sensor 339 that optically detects the edge of a wafer W placed on the stage 338 are installed in the pre-alignment processing chamber 336, and the wafer W is aligned in the pre-alignment processing chamber by rotating the wafer W on the stage 338 and detecting an orientation flat or a notch formed at the edge of the wafer W with the optical sensor 339. It is to be noted that a specific structural example that may be adopted in the cleaning processing chamber 400 is to be described later.

A transfer robot 370 which is allowed to slide freely along the longer side (along the direction indicated by the arrow in FIG. 11) is installed inside the transfer chamber 330. The transfer robot 370 is equipped with transfer arms 373A and 373B on which wafers W can be carried. The transfer arms 373A and 373B are capable of bending/extending, moving up/down and rotating, and are used to take wafers W into/out of the cassette containers 332A~332C, the pre-alignment processing chamber 336, the cleaning processing chamber 400, and loadlock chambers 360M and 360N to be detailed later. It is to be noted that the transfer robot 370 equipped with two transfer arms 373A and 373B is able to retrieve a processed wafer W and, at the same time, deliver a new unprocessed wafer W, at a loadlock chamber 360M or 360N, the pre-alignment process chamber 336, the cleaning processing chamber 400 or the like.

Next, an example of a structure that may be adopted in the processing unit 310 is explained. The processing unit 310 may adopt a cluster tool structure such as that shown in FIG. 11. Namely, the processing unit 310 includes a common transfer chamber 350 assuming a polygonal (e.g., hexagonal) shape, with a plurality of (e.g., six) processing chambers 340A~340F where wafers W are to undergo specific types of processing connected respectively via gate valves 344A~344F around the common transfer chamber 350.

Inside the processing chambers 340A~340F, stages 342A~342F on which wafers W are to be placed are respectively installed, and based upon process recipes or the like stored in advance in a storage medium such as or the like at a control unit 500, the wafers W on the stages 342 undergo processing such as film formation processing and etching within the processing chambers. It is to be noted that the quantity of processing chambers 340 is not limited to that shown in FIG. 11.

In addition, the loadlock chambers 360M and 360N which exchange wafers with the transfer chamber 330 are disposed around the common transfer chamber 350 as well. At the first and second loadlock chambers 360M and 360N, wafers W are temporarily held via transfer tables 364M and 364N respectively installed therein and after the wafers W undergo pressure adjustment, they are transferred between the vacuum pressure-side common transfer chamber 350 and the atmospheric pressure-side transfer chamber 330. Accordingly, in order to sustain the required level of air tightness, the loadlock chambers 360M and 360N are connected with the common transfer chamber 350 via gate valves 354M and 354N and are connected with the transfer chamber 330 via gate valves 362M and 362N respectively.

A transfer robot 380 which is allowed to slide freely along a guide rail 384 disposed along the longer side of the common transfer chamber 350 is installed in the common transfer chamber 350. The transfer robot 380 is equipped with transfer arms 383A and 383B on which wafers W can be carried. The transfer arms 383A and 383B are capable of bending/extending, moving up/down and rotating, and are used to take wafers W into/out of the individual processing chambers 340A~340F and the loadlock chambers 360M and 360N.

The transfer robot 380 may slide toward the base end of the common transfer chamber 260 to take wafers W into/out of the loadlock chambers 360M and 360N and the processing chambers 340A and 340F and may slide toward the front end of the common transfer chamber 350 to take wafers W into/out of the four remaining processing chambers 340B~340E.

It is to be noted that the transfer robot 380 equipped with the two transfer arms 383A and 383B is able to retrieve a processed wafer W and, at the same time, deliver a new, unprocessed wafer W, at a processing chambers 340A~340F, a loadlock chamber 360M or 360N.

It is to be noted that the substrate processing apparatus 300 includes the control unit 500 that controls the operations executed in the entire substrate processing apparatus, including the control of the transfer robots 370 and 380, the various gate valves 333, 344, 354 and 362, the pre-alignment processing chamber 336 and the cleaning processing chamber 400. The control unit 500 may be constituted with a CPU constituting the control unit main body, a ROM in which data required by the CPU to execute processing are stored, a RAM which includes a memory area used by the CPU when it executes various types of data processing and the like, a storage means such as a hard disk (HDD) or a memory where programs and the various data used when the CPU controls the various components are stored, a liquid crystal display at which an operation screen, a selection screen and the like are displayed, an input/output means that allows the operator to input various types of data such as process recipes and data to be edited and also output various types of data such as process recipes and process logs into a specific storage medium, various controllers used to control individual components constituting the substrate processing apparatus 300 and the like.

The substrate transfer device in the embodiment may be adopted in conjunction with each of the processing chambers 340A~340F, the pre-alignment processing chamber 336 and the cleaning processing chamber 400, to transfer a wafer W between a transfer arm and a stage in the substrate processing apparatus 300 structured as described above. In addition, the substrate transfer device 130 may also be adopted in a measurement processing chamber (e.g., a film thickness measurement processing chamber, a particle measurement processing chamber or the like, not shown) which may be disposed at the transfer chamber 330 in the substrate processing apparatus 300 to measure the results of the processing having been executed on the wafer W. In reference to the embodiment, a specific structural example that may be adopted when the substrate transfer device 130 is used in the cleaning processing chamber 400 among all these processing chambers.

(Operation of the Substrate Processing Apparatus)

Next, the operation of the substrate processing apparatus 300 is explained. The substrate processing apparatus 300 is engaged in operation by the control unit 500 based upon specific programs. For instance, a wafer W having been carried out of one of the cassette containers 332A~332C by the transfer robot 370 is taken into the pre-alignment processing chamber 336 to undergo positioning processing. The wafer W having undergone the positioning processing is then carried out of the pre-alignment processing chamber 336 and is taken into the loadlock chamber 360M or 360N. If a wafer W having undergone all the necessary processing is present in the loadlock chamber 360M or 360N, the processed wafer W is retrieved and an unprocessed wafer W is transferred into the loadlock chamber.

The wafer W having been carried into the loadlock chamber 360M or 360N is subsequently taken out of the loadlock chamber 360M or 360N by the transfer robot 380 which then carries it into a specific processing chamber among the processing chambers 340A~340F where it goes through a specific type of processing. For instance, as the wafer W having been carried into the processing chamber is placed onto the stage constituting a lower electrode, a specific processing gas is delivered through a showerhead constituting an upper electrode, the processing gas is then raised to plasma with predetermined high frequency power applied to the electrodes, and the specific type of processing such as etching or film formation is executed on the wafer W with the plasma thus generated. Once the processing is completed, the wafer W is carried out of the processing chamber 340 by the transfer robot 380 and if it is to undergo further processing, the transfer robot carries it into the next processing chamber 340.

Undesirable material may have settled on the lower side of the circumferential edge of the wafer W on the stage 342 having undergone the processing executed by using the plasma generated from the processing gas. For instance, when the surface of the wafer W is plasma-etched by using plasma generated from a fluorocarbon (CF) gas delivered as the processing gas, a byproduct (deposit) constituted of a fluorocarbon polymer (CF polymer) is formed through a competitive reaction (polymerization reaction) and this byproduct settles on the edge of the wafer W (e.g., the rear surface of the wafer W at the edge, which may include, for instance, a beveled area).

As the wafer W with such material settled thereupon is returned to one of the cassette containers 332A~332C, the edge of the wafer W may come into contact with a holding portion inside the cassette container, causing the material to become separated and fall onto the surface of another wafer W under the returned wafer. This, in turn, may cause a defect in the semiconductor device formed on the lower wafer W. Accordingly, such material settled onto the edge of the wafer W must be removed through cleaning processing.

In the substrate processing apparatus 300 achieved in the embodiment, the wafer W having undergone the processing in the individual processing chambers 340 is transferred into the cleaning processing chamber 400 via the loadlock chamber 360M or 360N, the edge of the wafer W is cleaned in the cleaning processing chamber 400 and only then is the wafer W returned to the initial cassette container among the cassette containers 332A~332C. Since any matter having settled onto the edge of the wafer W is removed through this cleaning processing, no undesirable matter flakes off from the wafer W when it is returned to, for instance, the cassette container 332A and thus, the surfaces of the other wafers W in the cassette container can be kept in clean conditions.

(Structural Example for the Cleaning Processing Chamber)

Figure 12:
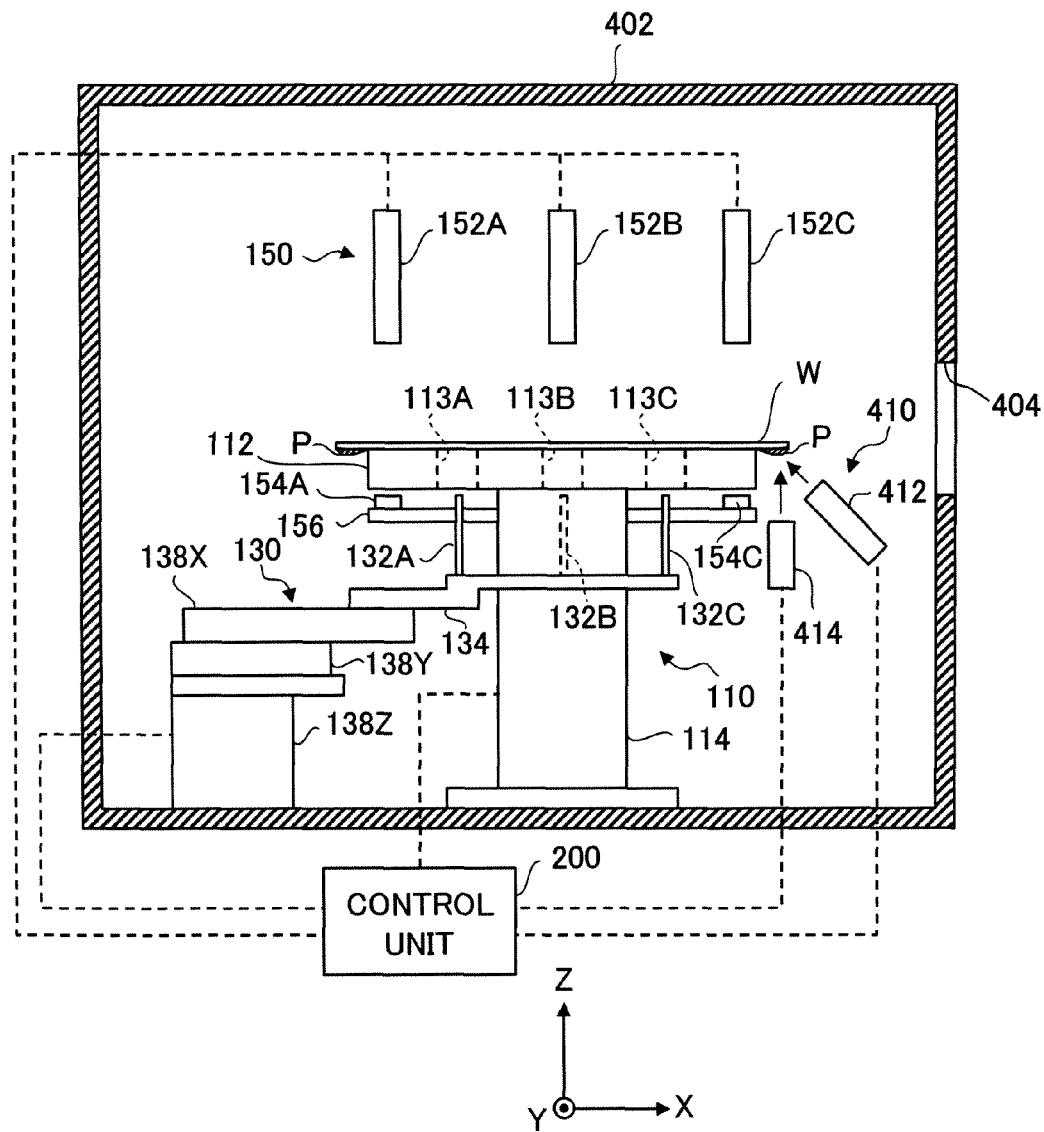
FIG. 12 is a side elevation showing an example of an internal structure that may be adopted in a cleaning processing chamber equipped with the substrate transfer device achieved in the embodiment.

A structural example that may be adopted in the cleaning processing chamber 400 is now explained. In the cleaning processing chamber 400 in the embodiment, the material having settled on the edge of the wafer W placed on the rotatable stage 112 is removed by radiating a specific type of light over the end area of the wafer W as the wafer W is rotated via the stage 112. This means that the wafer W needs to be positioned on the stage 112 accurately by preventing any misalignment along the horizontal direction. An explanation is now given on how the substrate transfer device 130 may be adopted in conjunction with this cleaning processing chamber 400. The cleaning processing chamber 400 may have a structure such as that shown in FIG. 12. The cleaning processing chamber 400 shown in FIG. 12 includes a stage unit 110, a substrate transfer device 130, a substrate position detection unit 150 and a cleaning means 410 all disposed in a container 402.

The cleaning means 410, in turn, includes a laser unit 412 and an ozone generator 414. The laser light source (not shown) in the laser unit 412 may be any of various types of lasers including a semiconductor laser, a gas laser or a solid-state laser. The optical axis of the laser unit 412 is adjusted so as to radiate laser light onto deposited material having settled onto the rear surface of the edge of the wafer W on the stage 112. The ozone generator 414 generates ozone ($O_3$) to be used as an oxygen-group reactive gas to decompose the deposited material P having settled on the rear surface of the edge of the wafer W and ejects the ozone thus generated toward the rear surface of the edge of the wafer W placed on the stage 112. The operations of the laser unit 412 and the ozone generator 414 are controlled by the control unit 200. It is to be noted that a discharging means (not shown) for suctioning out the ozone ($O_3$) as well as the carbon dioxide ($CO_2$) and fluorine ($F_2$) resulting from the decomposition of the deposited material P, may be disposed at a position facing opposite the ozone generator 414.

The cleaning processing executed in the cleaning processing chamber 400 to claim the wafer W is next explained. In the cleaning processing chamber 400, the substrate transfer device 130 and the substrate position detection unit 150 are installed as explained earlier and thus, the wafer W having been carried into the container 402 through a transfer port 404 on a transfer arm 373 of the transfer robot 370 can then be placed on the wafer placement surface of the stage 112 in an accurately aligned state. Even if the wafer W having been transferred from the transfer robot 370 onto the support pins 332A~332C is misaligned, the misalignment can be corrected by driving the support pins 332A~332C without having to utilize the transfer robot 370 and thus, the transfer robot 370 can be promptly engaged in the transfer of another wafer W.

Then, the rear surface of the wafer W around its edge is cleaned by the cleaning means 410. For instance, a CF-group polymer P having settled on the edge of the wafer W, can be removed through a decomposition reaction induced by placing an oxygen-group reactive gas in contact with the CF-group polymer P and radiating light. It is to be noted that different types of light and gases may be used as described below during this process.

For instance, while heating the edge of the wafer W so as to sustain the temperature at a specific level (e.g., approximately 200° C.), ultraviolet light may be radiated onto the CF-group polymer P and a flow of an oxygen-group reactive gas (e.g., oxygen ($O_2$)) may be formed near the surface of the CF-group polymer P. Through this method, the CF-group polymer P is separated into carbon dioxide ($CO_2$) and fluorine ($F_2$) and is thus removed through the process.

As an alternative, laser light may be radiated onto the CF-group polymer P while placing ozone ($O_3$) acting as an oxygen-group reactive gas in contact with the CF-group polymer P. In this case, high energy is delivered locally to the CF-group polymer P to promote the process of the decomposition reaction and thus, the CF-group polymer P can be removed efficiently.

By adopting either of these methods, the deposited material P having settled at the edge of the wafer W can be removed without having to polish the edge of the wafer W, and as a result, the task of removing the powdery dust resulting from the polishing process does not need to be performed and the issue of contamination caused by such powdery dust does not arise either. In addition, since the deposited material P having settled on the edge of the wafer W can be removed without having to generate plasma, the film (e.g., a low-k film) having been formed at the surface of the wafer W remains undamaged. In the embodiment, the cleaning processing is executed by using laser light in the cleaning processing chamber 400, as described above.

More specifically, the stage 112 with the wafer W placed thereupon is rotated, laser light is emitted from the laser unit 412 toward the rear surface of the edge of the wafer W and ozone ($O_3$) is output from the ozone generator 414. Through this method, any deposited material P having settled on the rear surface at the edge of the wafer W can be chemically decomposed and removed. It is desirable that the laser unit 412 be structured so that the laser light spot position can be moved along the radius of the wafer W when the deposited matter P has settled over an area greater than the diameter of the laser light spot. Such a structure assures complete removal of the deposited material P even when it has settled over a large area.

Once the cleaning processing is completed, the wafer W is lifted up along the vertical direction via the support pins 132A~132C again and is transferred to the transfer robot 370 having entered through the transfer port 404 of the container 402. The transfer robot 370 carries the wafer W having undergone the cleaning processing to the initial cassette container 332A, 332B or 332C via the transfer chamber 330. Since no deposited matter P flakes off from the cleaned wafer W, the surfaces of the other wafers W are kept in clean conditions.

If the stage 112 is rotated with the center of the wafer W placed thereupon offset relative to the rotational center of the stage 112, the wafer W will rotate in a decentered state. If the wafer W in the cleaning processing chamber 400 where the cleaning processing is executed to remove deposited matter having settled on the rear surface of the edge of the wafer W by using laser light, is decentered, the deposited matter P may not be completely removed due to, for instance, a small laser light spot diameter. However, the substrate transfer device 130 installed in the cleaning processing chamber 400 is capable of positioning the wafer W accurately (e.g., a tolerance of, for instance, several μm or less). As a result, very thorough cleaning processing can be executed.

In addition, a wafer having been taken out of a given cassette container among the cassette containers 332A~332C in the substrate processing apparatus 300 is first carried into the pre-alignment processing chamber 336 and the processing chambers 340A~340F to undergo specific types of processing and is then carried into a post-processing chamber such as the cleaning processing chamber 400 or a measurement processing chamber. The wafer W carried into the post-processing chamber, which has been repeatedly carried on transfer arms into/out of the plurality of processing chambers, is highly likely to have become greatly misaligned. Even if the wafer W has become misaligned to a great extent under such circumstances, the use of the substrate transfer device 130 achieved in the embodiment eliminates the need to take the wafer out of, and then to place it back into the post-processing chamber or the need to reposition the wafer W on the stage. Rather, the use of the substrate transfer device 130 makes it possible to promptly and accurately correct the misalignment by driving the support pins 132A~132C holding the wafer W thereupon along the horizontal direction. For this reason, the advantage of utilizing the substrate transfer device 130 in the post-processing chamber is significant.

While the invention has been particularly shown and described with respect to a preferred embodiment thereof by referring to the attached drawings, the present invention is not limited to these examples and it will be understood by those skilled in the art that various changes in form and detail may be made therein without departing from the spirit, scope and teaching of the invention.

What is claimed is:

1. A substrate lifting device that is configured separately from a transfer arm on which a substrate is carried, and transfers the substrate to/from said transfer arm and lifts/lowers the substrate off/onto a stage, comprising:

a plurality of support pins disposed at positions set apart from one another around a support shaft of said stage, which support the substrate on the bottom surface thereof;

a base at which said support pins are mounted;

a vertical drive means for raising/lowering said substrate off/onto said stage by driving said support pins up/down via said base; and a horizontal drive means for adjusting the substrate above said stage in any horizontal direction by horizontally driving said support pins via said base, wherein:

said plurality of support pins are disposed at positions further inward relative to the radius of said stage, and the front ends of said support pins are allowed to project out beyond and retract under a substrate placement surface of said stage via through holes formed at said stage; and said support pins are each horizontally driven inside the through holes by said horizontal drive means.

2. A substrate lifting device according to claim 1, wherein:

a substrate position detection means for detecting the position of the substrate along the horizontal direction supported on said support pins is disposed near said stage.

3. A substrate lifting device according to claim 2, wherein:

said substrate is a disk-shaped semiconductor wafer; and said substrate position detection means adopts a structure that enables detection of the circumferential edge of the substrate at, for instance, at least two points.

4. A substrate lifting device according to claim 2, further comprising:

a control unit that executes substrate transfer processing so as to receive the substrate delivered by said transfer arm by raising said support pins via said vertical drive means, detect the position of the substrate along the horizontal direction with the substrate position detection means while the substrate is supported on the support pins, correct any misalignment of the substrate by driving said support pins along the horizontal direction via the horizontal drive means and finally place the substrate onto said stage by lowering said support pins via said vertical drive means.

5. A substrate lifting device according to claim 4, wherein:

when taking the substrate off said transfer arm, the substrate is placed onto said support pins in a raised state by lowering said transfer arm.

6. A substrate lifting device according to claim 1, wherein:

said stage is allowed to rotate freely around the support shaft; and when said stage is rotated, said support pins are lowered so as to set the front ends of said support pins at a position lower than the bottom surface of said stage.

7. A substrate processing apparatus that executes a specific type of processing on a substrate placed on a stage disposed inside a processing chamber, comprising:

a substrate lifting device that is configured separately from a transfer arm on which the substrate is carried into/out of said processing chamber, and transfers the substrate from/to said transfer arm and lifts/lowers the substrate off/onto said stage, is disposed near said stage;

said substrate lifting device includes:

a plurality of support pins disposed at positions set apart from one another around a support shaft of said stage, which supports the substrate on the bottom surface thereof;

a base at which said support pins are mounted;

a vertical drive means for raising/lowering said substrate off/onto said stage by driving said support pins up/down via said base; and a horizontal drive means for adjusting the substrate above said stage in any horizontal direction by horizontally driving said support pins via said base, wherein:

said plurality of support pins are disposed at positions further inward relative to the radius of said stage, and the front ends of said support pins are allowed to project out beyond and retract under a substrate placement surface of said stage via through holes formed at said stage; and said support pins are each horizontally driven inside the through holes by said horizontal drive means.

8. A substrate processing apparatus that includes a plurality of processing chambers where specific types of processing are executed on substrates and processes a substrate continuously by transferring the substrate to said processing chambers in sequence via a transfer arm, wherein:

at least one of said processing chambers is used as a post-processing chamber to which the substrate having undergone processing in another processing chamber is transferred to undergo post-processing; and said post-processing chamber includes:

a stage on which the substrate is place; and a substrate lifting device that is configured separately from said transfer arm, and transfers the substrate from/to said transfer arm and lifts/lowers the substrate off/onto said stage; and said substrate lifting device includes:

a plurality of support pins disposed at positions set apart from one another around a support shaft of said stage, which supports the substrate on the bottom surface thereof;

a base at which said support pins are mounted;

a vertical drive means for raising/lowering said substrate off/onto said stage by driving said support pins up/down via said base; and a horizontal drive means for adjusting the substrate above said stage in any horizontal direction by horizontally driving said support pins via said base, wherein:

said plurality of support pins are disposed at positions further inward relative to the radius of said stage, and the front ends of said support pins are allowed to project out beyond and retract under a substrate placement surface of said stage via through holes formed at said stage; and said support pins are each horizontally driven inside the through holes by said horizontal drive means.

* * * * *